(12) United States Patent
Lee et al.

(10) Patent No.: US 10,170,525 B2
(45) Date of Patent: Jan. 1, 2019

(54) ORGANIC LIGHT EMITTING DISPLAY DEVICE

(71) Applicant: Samsung Display Co., Ltd., Yongin-si, Gyeonggi-Do (KR)

(72) Inventors: Chang-Ho Lee, Busan (KR); Dae-Woo Kim, Cheonan-si (KR); Jin-A Lee, Seongnam-si (KR); Myung-Koo Hur, Asan-si (KR)

(73) Assignee: Samsung Display Co., Ltd. (KR)

( * ) Notice: Subject to any disclaimer, the term of this patent is extended or adjusted under 35 U.S.C. 154(b) by 22 days.

(21) Appl. No.: 15/349,179

(22) Filed: Nov. 11, 2016

(65) Prior Publication Data

US 2017/0133444 A1  May 11, 2017

(30) Foreign Application Priority Data

Nov. 11, 2015 (KR) .......................... 10-2015-0157972

(51) Int. Cl.
*H01L 29/49* (2006.01)
*H01L 27/32* (2006.01)
*H01L 51/52* (2006.01)

(52) U.S. Cl.
CPC ...... *H01L 27/3246* (2013.01); *H01L 27/3248* (2013.01); *H01L 27/3258* (2013.01); *H01L 27/3262* (2013.01); *H01L 27/3276* (2013.01); *H01L 51/5253* (2013.01)

(58) Field of Classification Search
CPC .............................. H01L 51/0097; G03F 7/20
See application file for complete search history.

(56) References Cited

U.S. PATENT DOCUMENTS

| | | | |
|---|---|---|---|
| 2010/0001639 A1* | 1/2010 | Kim .................... | H01L 27/3227 313/524 |
| 2010/0177265 A1 | 7/2010 | Jung et al. | |
| 2012/0097928 A1* | 4/2012 | Kim .................... | H01L 27/3267 257/40 |
| 2016/0141351 A1* | 5/2016 | You ..................... | H01L 27/3276 257/40 |

* cited by examiner

*Primary Examiner* — Michael Shingleton
(74) *Attorney, Agent, or Firm* — Innovation Counsel LLP

(57) ABSTRACT

An organic light emitting display device includes a substrate, a gate insulation layer, a planarization layer, a boundary pattern, and a sub-pixel structure. The substrate includes a sub-pixel region and a transparent region. The gate insulation layer is disposed on the substrate. The planarization layer is disposed in the sub-pixel region on the gate insulation layer, and exposes the transparent region. The boundary pattern covers a boundary of the sub-pixel region and the transparent region. The sub-pixel structure is disposed on the planarization layer.

16 Claims, 18 Drawing Sheets

ORGANIC LIGHT EMITTING DISPLAY DEVICE

CROSS-REFERENCE TO RELATED APPLICATION(S)

This application claims priority under 35 USC § 119 to Korean Patent Applications No. 10-2015-0157972, filed on Nov. 11, 2015 in the Korean Intellectual Property Office (KIPO), the contents of which are incorporated herein in its entirety by reference.

BACKGROUND

1. Field

Example embodiments relate generally to organic light emitting display devices. More particularly, embodiments of the present inventive concept relate to organic light emitting display devices including a transparent region.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting display (OLED) device. Compared to the LCD device, the OLED device has many advantages such as a higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, thereby a light of a certain wavelength can be emitted.

Recently, a transparent OLED device capable of transmitting an image of an object (or target) that is located in the rear (e.g., the back) of the OLED device by including a sub-pixel region and a transparent region has been developed. Here, insulation layers (e.g., a gate insulation layer, an insulating interlayer, etc) including inorganic materials and insulation layers (e.g., a planarization layer, a pixel defining layer, etc) including organic materials may be disposed in the OLED device. For example, the insulation layer including the inorganic materials may be exposed by removing a portion of the insulation layer including the organic materials in the transparent region. In this case, since adhesion between the organic insulation layer and the inorganic insulation layer is low, the organic insulation layer and the inorganic insulation layer may be detached to each other in a portion where the organic insulation layer and the inorganic insulation layer are contacted. As a result, water or moisture may be permeated into a separated space where the organic insulation layer and the inorganic insulation layer are detached to each other, and then dark pixels may be generated in the OLED device.

SUMMARY

Some example embodiments provide an organic light emitting display device capable of transmitting an image of an object that is located in the rear of the organic light emitting display device.

According to some aspect of example embodiments, an organic light emitting display (OLED) device includes a substrate, a gate insulation layer, a planarization layer, a boundary pattern, and a sub-pixel structure. The substrate includes a sub-pixel region and a transparent region. The gate insulation layer is disposed on the substrate. The planarization layer is disposed in the sub-pixel region on the gate insulation layer, and exposes the transparent region. The boundary pattern which covers a boundary of the sub-pixel region and the transparent region. The sub-pixel structure is disposed on the planarization layer.

In example embodiments, the OLED device may further include a pixel defining layer on the planarization layer, the pixel defining layer exposing the transparent region.

In example embodiments, the pixel defining layer may expose at least a portion of an upper surface of the boundary pattern in the transparent region.

In example embodiments, the boundary pattern may include a first boundary extension and a second boundary extension. The first boundary extension may extend in a direction from the boundary of the sub-pixel region and the transparent region into the sub-pixel region, and may extend onto the sidewall of the planarization layer. The second boundary extension may extend in a direction from the boundary of the sub-pixel region and the transparent region into the transparent region, and may extending onto an upper surface of the gate insulation layer that is located in transparent region on the substrate.

In example embodiments, the first boundary extension and the second boundary extension may be integrally formed, and the boundary pattern may cover a portion where the sidewall of the planarization layer, a lower surface of the planarization layer, and an upper surface of the gate insulation layer are simultaneously contacted.

The sub-pixel structure may include a lower electrode on the planarization layer, a light emitting layer on the lower electrode and an upper electrode on the light emitting layer wherein the upper electrode and the boundary pattern are simultaneously formed using the same materials.

The OLED device may further include an insulating interlayer disposed between a gate electrode and the planarization layer. The boundary pattern may include a first boundary extension extending in a direction from the boundary of the sub-pixel region and the transparent region into the sub-pixel region, the first boundary extension extending onto the sidewall of the insulating interlayer, and a second boundary extension extending in a direction from the boundary of the sub-pixel region and the transparent region into the transparent region, the second boundary extension extending onto an upper surface of the gate insulation layer that is located in transparent region on the substrate.

The first boundary extension and the second boundary extension may be integrally formed, and the boundary pattern may cover a portion where the sidewall of the insulating interlayer and an upper surface of the gate insulation layer are simultaneously contacted.

The sub-pixel structure may include a lower electrode on the planarization layer, a light emitting layer on the lower electrode and an upper electrode on the light emitting layer. The upper electrode and the boundary pattern may be simultaneously formed using the same materials.

The OLED device may further include an insulating interlayer disposed between a gate electrode and the planarization layer. The boundary pattern may include a first boundary portion covered by the insulating interlayer and a second boundary extension extending from the boundary of the sub-pixel region and the transparent region onto an upper surface of the gate insulation layer that is located in transparent region on the substrate.

The gate electrode of a transistor in the sub-pixel region and the boundary pattern may be simultaneously formed using the same materials.

In example embodiments, the boundary pattern may have a hinge shape.

In example embodiments, the sub-pixel structure may include a lower electrode, a light emitting layer, and an upper electrode. The lower electrode may be disposed on the planarization. The light emitting layer may be disposed on the lower electrode. The upper electrode may be disposed on the light emitting layer. The upper electrode may be disposed in the sub-pixel region, and may expose the gate insulation layer that is located in the transparent region on the substrate.

In example embodiments, the lower electrode may include a first transparent electrode film, a reflective electrode film, and a second transparent electrode film. The first transparent electrode film may have a first thickness, and may be disposed on the planarization layer. The reflective electrode film may have a second thickness, and may be disposed on the first transparent electrode film. The second thickness may be greater than the first thickness. The second transparent electrode film may have a third thickness, and may be disposed on the reflection electrode film. The third thickness may be less than the first thickness.

In example embodiments, the OLED device may further include a protection pattern. The protection pattern may have the third thickness, and may be disposed on the second transparent electrode film. The protection pattern may cover the lower electrode.

In example embodiments, the boundary pattern and the protection pattern may be simultaneously formed using the same materials.

In example embodiments, the OLED device may further include a semiconductor element. The semiconductor element may be disposed in the sub-pixel region on the substrate. The semiconductor element may include an active layer on the substrate, a gate electrode on the gate insulation layer covering the active layer, and source and drain electrodes on the gate electrode.

In example embodiments, the OLED device may further include an insulating interlayer. The insulating interlayer may be interposed between the gate insulation layer and the planarization layer, and may cover the gate insulation layer in the sub-pixel region on the substrate. The insulating interlayer may expose the gate insulation layer that is located in the transparent region on the substrate.

In example embodiments, the boundary pattern and the gate electrode may be located at the same level.

According to some aspect of example embodiments, an organic light emitting display (OLED) device includes a substrate, a gate insulation layer, a planarization layer, an insulating interlayer, a boundary pattern, and a sub-pixel structure. The substrate includes a sub-pixel region and a transparent region. The gate insulation layer is disposed on the substrate. The planarization layer is disposed in the sub-pixel region on the gate insulation layer, and exposes the transparent region. The insulating interlayer is interposed between the gate insulation layer and the planarization layer in the sub-pixel region on the substrate, and exposes the gate insulation layer that is located in the transparent region on the substrate. The boundary pattern is in simultaneously contact with a lower surface of the planarization layer, an upper surface of the gate insulation layer, and a side wall of the insulating interlayer in a boundary of the sub-pixel region and the transparent region. The sub-pixel structure is disposed on the planarization layer.

In example embodiments, the OLED device may further include a semiconductor element. The semiconductor element may be disposed in the sub-pixel region on the substrate. The semiconductor element may include an active layer on the substrate, a gate electrode on the gate insulation layer covering the active layer, and source and drain electrodes on the insulating interlayer covering the gate electrode. The boundary pattern and the gate electrode may be simultaneously formed at the same level by using the same materials.

In example embodiments, the OLED device may further include a pixel defining layer. The pixel defining layer may be disposed on the planarization layer and the boundary pattern such that the gate insulation layer that is located in the transparent region on the substrate is exposed.

In example embodiments, the OLED device may further include a pixel defining layer. The pixel defining layer may be disposed on the planarization layer such that the gate insulation layer that is located in the transparent region on the substrate is exposed.

According to some aspect of example embodiments, an organic light emitting display (OLED) device includes a substrate, a gate insulation layer, a planarization layer, an insulating interlayer, a lower electrode, a boundary pattern, a light emitting layer, and an upper electrode. The substrate includes a sub-pixel region and a transparent region. The gate insulation layer is disposed on the substrate. The planarization layer is disposed in the sub-pixel region on the gate insulation layer, and exposes the gate insulation layer that is located in the transparent region on the substrate. The insulating interlayer is interposed between the gate insulation layer and the planarization layer in the sub-pixel region on the substrate, and exposes the gate insulation layer that is located in the transparent region on the substrate. The lower electrode is disposed on the planarization layer. The boundary pattern is disposed adjacent to the planarization layer on the gate insulation layer in a boundary of the sub-pixel region and the transparent region. The light emitting layer is disposed on the lower electrode. The upper electrode is disposed on the light emitting layer.

In example embodiments, the OLED device may further include a semiconductor element. The semiconductor element may be disposed in the sub-pixel region on the substrate. The semiconductor element may include an active layer on the substrate, a gate electrode on the gate insulation layer covering the active layer, and source and drain electrodes on the insulating interlayer covering the gate electrode. The boundary pattern and the gate electrode may be simultaneously formed at the same level by using the same materials.

In example embodiments, the OLED device may further include a pixel defining layer. The a pixel defining layer may be disposed on the planarization layer and the boundary pattern such that the gate insulation layer that is located in the transparent on the substrate is exposed.

An OLED device according to example embodiments includes a boundary pattern and a protection pattern. As the protection pattern completely covers a lower electrode, the protection pattern may protect the lower electrode from etchants that are used in a forming process of the pixel defining layer. In addition, as the boundary pattern is simultaneously contacted with both a sidewall of the planarization layer and an upper surface of the gate insulation layer in a boundary of the sub-pixel region and the transparent region, the pixel defining layer including organic materials may not be directly contacted with the gate insulation layer including inorganic materials. That is, the pixel defining layer may be contacted with an upper surface of the boundary pattern formed of transparent conductive materials that the contact characteristic is relatively greater than the gate insulation layer, and the boundary pattern may prevent that water or moisture is permeated into between the pixel defining layer and the gate insulation layer in a boundary of the sub-pixel region and the transparent region. Accordingly, the interface between the pixel defining layer 310 and the gate insulation layer 150 may be prevented from being detached and, thus, dark pixels in the OLED device may be prevented.

BRIEF DESCRIPTION OF THE DRAWINGS

Example embodiments can be understood in more detail from the following description taken in conjunction with the accompanying drawings, in which.

DETAILED DESCRIPTION OF THE EMBODIMENTS

Hereinafter, embodiments of the present inventive concept will be explained in detail with reference to the accompanying drawings.

Figure 1:
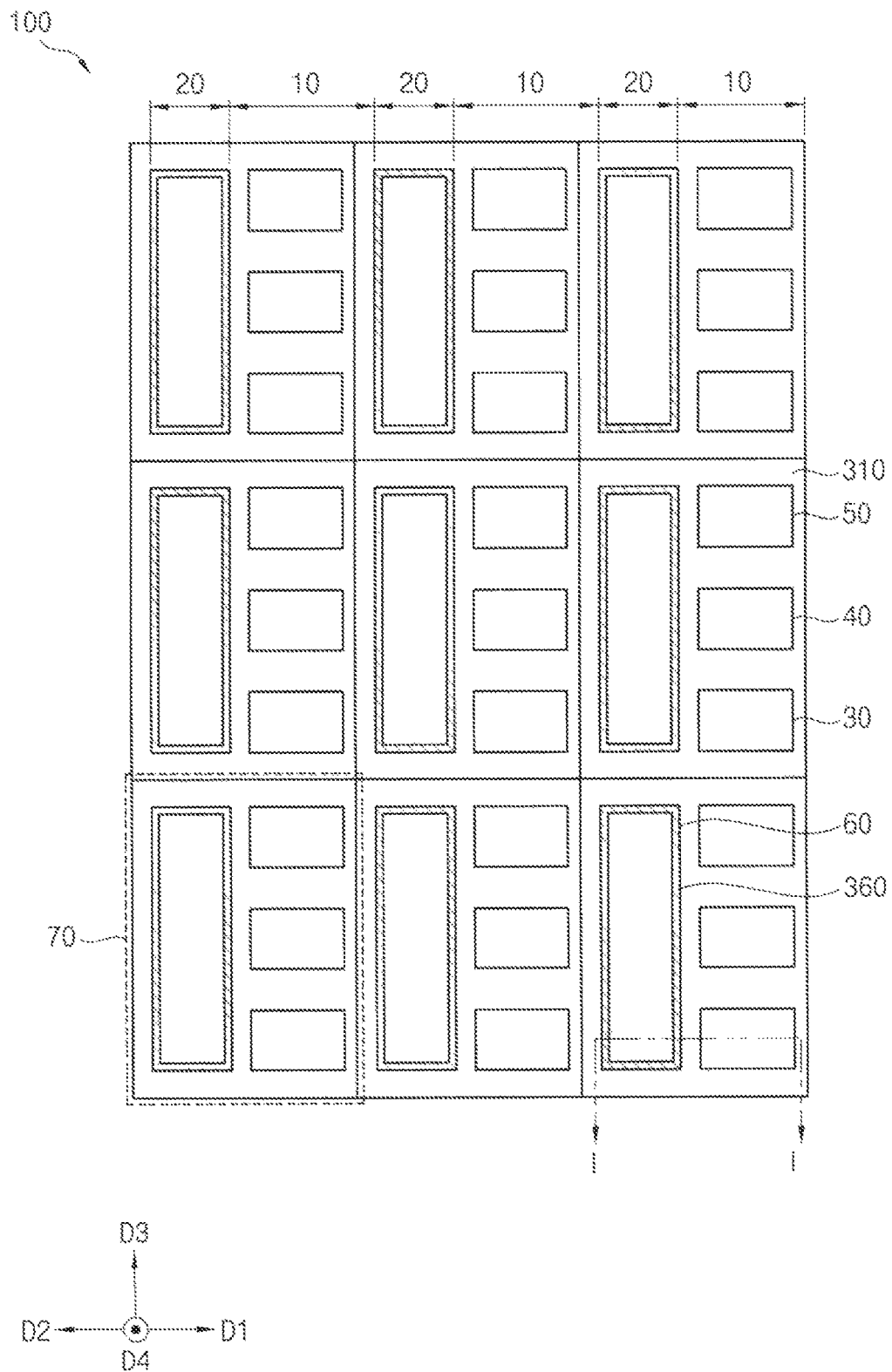
FIG. 1 is a planar view illustrating an organic light emitting display (OLED) device in accordance with example embodiments.

FIG. 1 is a planar view illustrating an organic light emitting display (OLED) device in accordance with example embodiments.

Referring to FIG. 1, an organic light emitting display (OLED) device 100 may include a plurality of pixel regions 70. The pixel regions 70 may be disposed on the entire substrate which will be described below. The pixel regions 70 may be arranged in a first direction D1 that is parallel to an upper surface of a substrate included in the OLED device 100, a second direction D2 that is opposite to the first direction D1, and a third direction D3 that is perpendicular to the first direction D1 and the second direction D2.

One pixel region 70 may have a sub-pixel region 10 and a transparent region 20. First through third sub-pixel regions 30, 40, and 50 may be located in the sub-pixel region 10, and a transparent window 60 may be located in the transparent region 20.

Each of first through third sub-pixels may be disposed in the first through third sub-pixel regions 30, 40, and 50, respectively. For example, the first sub-pixel may emit a red color of light, and the second sub-pixel may emit a green color of light. In addition, the third sub-pixel may emit a blue color of light. The first through third sub-pixels may be disposed at the same level on the substrate.

In the sub-pixel region 10, a light incident from the outside may travel through the transparent window 60. The first through third sub-pixel regions 30, 40, and 50 may share one transparent window 60. Alternatively, the first through third pixel region 30, 40, and 50 may share a plurality of transparent windows 60.

The first through third sub-pixel regions 30, 40, and 50 and the transparent region 20 may be substantially surrounded by a pixel defining layer 310 that will be described below. That is, the first through third sub-pixel regions 30, 40, and 50 may be defined by the pixel defining layer 310 included in the OLED device 100, and the pixel defining layer 310 may expose the first through third sub-pixel regions 30, 40, and 50 and the transparent region 20. Common lines (e.g., scan lines, data lines, power supply voltage lines, etc) may be disposed under the pixel defining layer 310. The common lines may be electrically connected to the first through third sub-pixels. Alternatively, the pixel defining layer 310 may expose the first through third sub-pixel regions 30, 40, and 50, and may cover the transparent region 20. That is, the transparent region 20 of the OLED device 100 may be defined without an opening of the pixel defining layer 310 in the transparent region 20.

In example embodiments, a gate insulation layer will be described below may be disposed on the substrate, and the pixel defining layer 310 may be disposed on the gate insulation layer included in the OLED device 100. In the boundary of the sub-pixel region 10 and the transparent region 20, a boundary pattern 360 may be disposed between the gate insulation layer and the pixel defining layer 310. For example, the boundary pattern 360 may be in contact with both an upper surface of the gate insulation layer, a lower surface of the pixel defining layer 310. As the OLED device 100 in accordance with example embodiments includes the boundary pattern 360, the pixel defining layer 310 including organic materials and the gate insulation layer including inorganic materials may not be directly contacted in the boundary of the sub-pixel region 10 and the transparent region 20. Accordingly, dark pixels may not be generated in the OLED device 100.

The first through third sub-pixel regions 30, 40, and 50 of the pixel region 70 may display a displaying image in a fourth direction D4 (e.g., the front of the OLED device 100) that is vertical to the first through third directions D1, D2, and D3, and the transparent region 20 of the pixel region 70 may display an image of an object that is located in the back of the OLED device 100 in the fourth direction D4 through the transparent window 60. Accordingly, the OLED device 100 may serve as a transparent OLED device.

In example embodiments, one pixel region 70 includes three sub-pixel regions and one transparent region, but not being limited thereto. For example, one pixel region 70 may include a plurality of sub-pixel regions and a plurality of transparent regions.

In addition, in example embodiments, an arrangement of a plurality of pixel regions 70 is regularly arranged, but not being limited thereto. In some example embodiments, the pixel regions 70 may be irregularly arranged.

Figure 2:
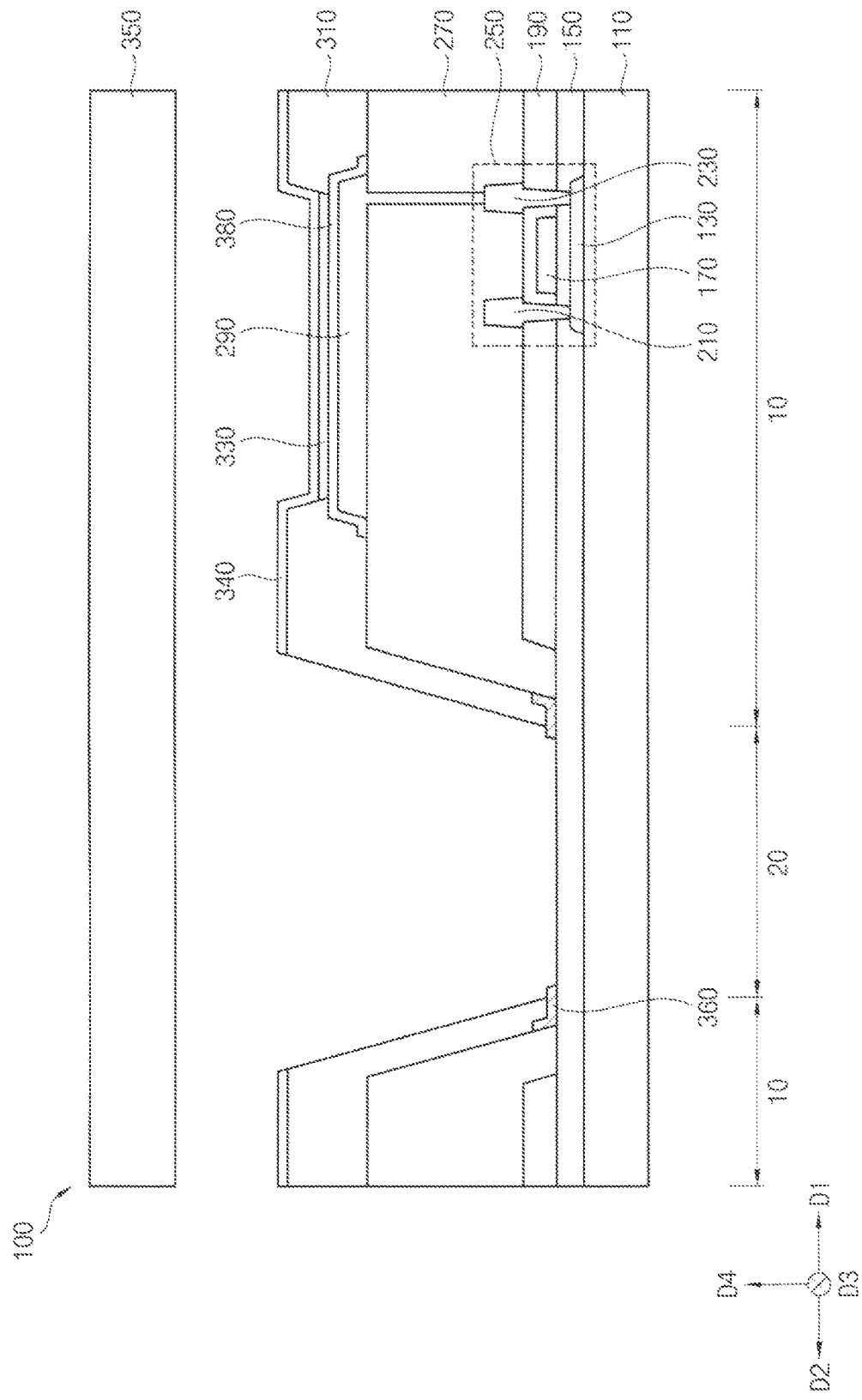
FIG. 2 is a cross-sectional view taken along a line I-I' of FIG. 1.
Figure 3:
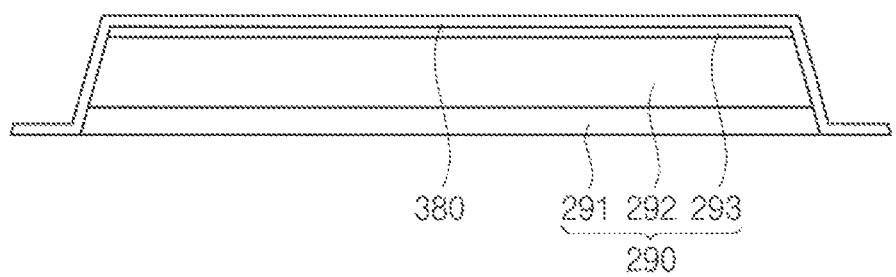
FIG. 3 is a cross-sectional view for describing a lower electrode and a protection pattern of FIG. 2.
Figure 4:
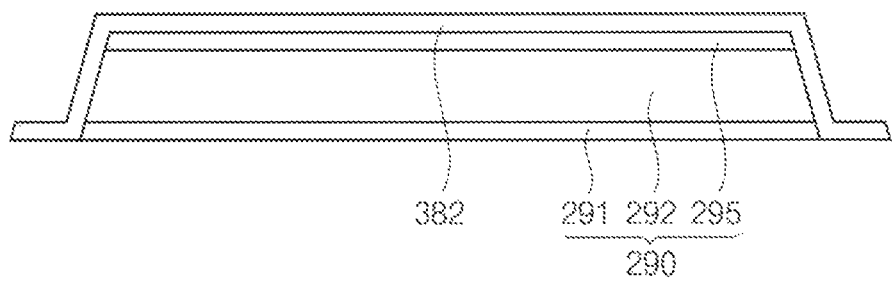
FIG. 4 is a cross-sectional view illustrating an example of a lower electrode and a protection pattern of FIG. 2.

FIG. 2 is a cross-sectional view taken along a line I-I' of FIG. 1, and FIG. 3 is cross-sectional view for describing a lower electrode and a protection pattern of FIG. 2. FIG. 4 is cross-sectional view illustrating an example of a lower electrode and a protection pattern of FIG. 2.

Referring to FIGS. 2 through 4, an organic light emitting display (OLED) device 100 may include a substrate 110, a semiconductor element 250, a planarization layer 270, a sub-pixel structure, a boundary pattern 360, a protection pattern 380, a pixel defining layer 310, an encapsulation substrate 350, etc. Here, the semiconductor element 250 may include an active layer 130, a gate insulation layer 150, a gate electrode 170, an insulating interlayer 190, a source electrode 210, and a drain electrode 230. The sub-pixel structure may include a lower electrode 290, a light emitting layer 330, and an upper electrode 340. As illustrated in FIG. 3, the lower electrode 290 may include a first transparent electrode film 291, a reflective electrode film 292, and a second transparent electrode film 293. Further, the first transparent electrode film 291 may have a first thickness, and the reflective electrode film 292 may have a second thickness that is greater than the first thickness. Each of the second transparent electrode film 293, the protection pattern 380, and the boundary pattern 360 may have a thickness less than the first thickness. The second transparent electrode film 293, the protection pattern 380, and the boundary pattern 360 may have the same thickness.

As illustrated in FIG. 1, the OLED device 100 may include a plurality of pixel regions. One pixel region may have a sub-pixel region 10 and a transparent region 20. A display image may be displayed in a fourth direction D4 that is vertical to an upper surface of the OLED device 100 in the sub-pixel region 10, and an image of an object that is located in a direction that is opposite to the fourth direction D4 may be display in the fourth direction D4 through the transparent region 20. The OLED device 100 may serve as a transparent OLED device.

The substrate 110 may be formed of transparent materials. For example, the substrate 110 may include a quartz substrate, a synthetic quartz substrate, a calcium fluoride substrate, a fluoride-doping quartz substrate, a sodalime substrate, a non-alkali substrate etc. Alternatively, the substrate 110 may be formed of a flexible transparent material such as a flexible transparent resin substrate (e.g., a polyimide substrate). For example, the polyimide substrate may include a first polyimide layer, a barrier film layer, a second polyimide layer, etc. Since the polyimide substrate is relatively thin and flexible, the polyimide substrate may be disposed on a rigid glass substrate to help support the formation of the sub-pixel structure. That is, the substrate 110 may have a structure in which the first polyimide layer, the barrier film layer and the second polyimide layer are stacked on the rigid glass substrate. In a manufacturing the OLED device 100, after an insulating layer (e.g., a buffer layer) is provided on the second polyimide layer of the polyimide substrate, and the semiconductor element 250 and the sub-pixel structure (e.g., the lower electrode 290, the light emitting layer 330, and the upper electrode 340) may be disposed on the insulating layer. After the semiconductor element 250 and the sub-pixel structure are formed on the insulating layer, the rigid glass substrate under which the polyimide substrate is disposed may be removed. It may be difficult to directly form the semiconductor element 250 and the sub-pixel structure on the polyimide substrate because the polyimide substrate is relatively thin and flexible. Accordingly, the semiconductor element 250 and the sub-pixel structure are formed on the polyimide substrate and the rigid glass substrate, and then the polyimide substrate may serve as the substrate 110 of the OLED device 100 after the removal of the rigid glass substrate. As OLED device 100 includes the sub-pixel region 10 and the transparent region 20, the substrate 110 may also include the sub-pixel region 10 and the transparent region 20.

A buffer layer (not shown) may be disposed on the substrate 110. The buffer layer may be disposed on the entire substrate 110. The buffer layer may prevent the diffusion of metal atoms and/or impurities from the substrate 110 into the semiconductor element 250 and the sub-pixel structure. Additionally, the buffer layer may control a rate of a heat transfer in a crystallization process for forming the active layer 130, thereby obtaining a substantially uniform active layer. Furthermore, the buffer layer may improve a surface flatness of the substrate 110 when a surface of the substrate 110 is relatively irregular. According to a type of the substrate 110, at least two buffer layers may be provided on the substrate 110, or the buffer layer may not be disposed. For example, the buffer layer may include organic materials or inorganic materials.

The semiconductor element 250 may be formed of the active layer 130, the gate insulation layer 150, the gate electrode 170, the insulating interlayer 190, the source electrode 210, and the drain electrode 230.

The active layer 130 may be disposed in the sub-pixel region 10 on the substrate 110. For example, the active layer 130 may be formed of an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may cover the active layer 130 in the sub-pixel region 10 on the substrate 110, and may be disposed on the entire substrate 110. For example, the gate insulation layer 150 may sufficiently cover the active layer 130, and may have a substantially even surface without a step around the active layer 130. Alternatively, the gate insulation layer 150 may cover the active layer 130, and may be disposed as a substantially uniform thickness along a profile of the active layer 130. The gate insulation layer 150 may be formed of a silicon compound, a metal oxide, etc. For example, the gate insulation layer 150 may include silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc. In example embodiments, the gate insulation layer 150 may include inorganic materials.

The gate electrode 170 may be disposed on the gate insulation layer 150. The gate electrode 170 may be disposed on the active layer 130 in the sub-pixel region 10 with a gate insulating layer 150 interposed between the active layer 130 and the gate electrode 170. The gate electrode 170 may be formed of a metal, a metal alloy, metal nitride, conductive metal oxide, transparent conductive materials, etc. For example, the gate electrode 170 may include aluminum (Al), an alloy of aluminum, aluminum nitride ($AlN_x$), silver (Ag), an alloy of silver, tungsten (W), tungsten nitride ($WN_x$), copper (Cu), an alloy of copper, nickel (Ni), chrome (Cr), chrome nitride ($CrN_x$), molybdenum (Mo), an alloy of molybdenum, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), stannum oxide ($SnO_x$), indium oxide ($InO_x$), gallium oxide ($GaO_x$), indium tin oxide (ITO), indium zinc oxide (IZO), etc. These may be used alone or in a suitable combination thereof. Alternatively, the gate electrode 170 may have a multilayer structure.

The insulating interlayer 190 may be disposed in the sub-pixel region 10 on the gate insulation layer 150 and the gate electrode 170. The insulating interlayer 190 may cover the gate electrode 170 in the sub-pixel region 10, and may expose the gate insulation layer 150 that is located in the transparent region 20 on the substrate 110. For example, the insulating interlayer 190 may sufficiently cover the gate electrode 170, and may have a substantially even surface without a step around the gate electrode 170. Alternatively, the insulating interlayer 190 may cover the gate electrode 170, and may be disposed as a substantially uniform thickness along a profile of the gate electrode 170. The insulating interlayer 190 may include a silicon compound, a metal oxide, etc. The insulating interlayer 190 may insulate the gate electrode 170 from being contacting a source electrode 210 and a drain electrode 230 which will be formed on the insulating interlayer 190.

The source electrode 210 and the drain electrode 230 may be disposed in the sub-pixel region 10 on the insulating interlayer 190. The source electrode 210 may be in contact with a first side of the active layer 130 via a contact hole formed by removing a portion of the gate insulation layer 150 and the insulating interlayer 190. The drain electrode 230 may be in contact with a second side of the active layer 130 via a contact hole formed by removing a portion of the gate insulation layer 150 and the insulating interlayer 190. Each of the source electrode 210 and the drain electrode 230 may be formed of a metal, an alloy, metal nitride, conductive metal oxide, transparent conductive materials, etc. These may be used alone or in a suitable combination thereof. Alternatively, each of the source electrode 210 and the drain electrode 230 may have a multilayer structure. Accordingly, the semiconductor element 250 including the active layer 130, the gate insulation layer 150, the gate electrode 170, the insulating interlayer 190, the source electrode 210, and the drain electrode 230 may be disposed.

The planarization layer 270 may be disposed on the insulating interlayer 190, a portion of the gate insulation layer 150, the source electrode 210, and the drain electrode 230. The planarization layer 270 may have a first opening exposing the gate insulation layer 150 in the transparent region 20. For example, the planarization layer 270 may be disposed as a relatively high thickness to sufficiently cover the insulating interlayer 190, the source electrode 210, and the drain electrode 230. In this case, the planarization layer 270 may have a substantially even upper surface, and a planarization process may be further performed on the planarization layer 270 to implement the even upper surface of the planarization layer 270. The planarization layer 270 may include organic materials or inorganic materials. In example embodiments, the planarization layer 270 may include organic materials. For example, the planarization layer 270 may be formed of a photoresist, a polyacryl-based resin, a polyimide-based resin, a polyamide-based resin, a siloxane-based resin, an acryl-based resin, an epoxy-based resin, etc.

The lower electrode 290 may be disposed in the sub-pixel region 10 on the planarization layer 270. For example, a thickness of the lower electrode 290 may be greater than that of the upper electrode 340 such that a light emitted from the light emitting layer 330 is reflected in the fourth direction D4. The lower electrode 290 may be in contact with the drain electrode 230 via a contact hole formed by removing a portion of the planarization layer 270. In addition, the lower electrode 290 may be electrically connected to the semiconductor element 250. The OLED device 100 may display a display image in the fourth direction D4 in the sub-pixel region 10 (e.g., a top-emission structure). Thus, the lower electrode 290 may include a light reflection layer. For example, as illustrated in FIG. 3, the lower electrode 290 may have a multilayer structure. The multilayer structure may include the first transparent electrode film 291, the reflective electrode film 292, and the second transparent electrode film 293. The first transparent electrode film 291 may be disposed in the sub-pixel region 10 on the planarization layer 270, and the reflective electrode film 292 and the second transparent electrode film 293 may be sequentially disposed on the first transparent electrode film 291. Here, the first transparent electrode film 291 may have a first thickness, and the first thickness may be about 100 angstroms. The reflective electrode film 292 may have a second thickness that is greater than the first thickness, and the second thickness may be about 1000 angstroms. The second transparent electrode film 293 may have a third thickness that is less than the first thickness, and the third thickness may be about 75 angstroms. The first transparent electrode film 291 and the second transparent electrode film 293 may include substantially the same materials, and the reflective electrode film 292 may be interposed between the first transparent electrode film 291 and the second transparent electrode film 293. In addition, the protection pattern 380 and the second transparent electrode film 293 may have a same thickness, the third thickness, and the protection pattern 380, the first transparent electrode film 291, and the second transparent electrode film 293 may include the same materials. Alternatively, the protection pattern 380 may have a thickness that is greater than the third thickness.

In some example embodiments, as illustrated in FIG. 4, the first transparent electrode film 291 may have a first thickness, and the reflective electrode film 292 may have a second thickness that is greater than the first thickness. The second transparent electrode 295 may have the first thickness. The first transparent electrode film 291 and the second transparent electrode 295 may include the same materials, and may have the same thickness. In addition, the reflective electrode film 292 may be interposed between the first transparent electrode film 291 and the second transparent electrode 295. Further, the protection pattern 382 may have the first thickness, and the protection pattern 382, the first transparent electrode film 291, and the second transparent electrode 295 may include the same materials.

Referring again to FIG. 3, the first transparent electrode film 291 may cover an uneven upper surface of the planarization layer 270. As the first transparent electrode film 291 is disposed on the planarization layer 270, the first transparent electrode film 291 may help the formation of the reflective electrode film 292. As the second transparent electrode film 293 is disposed on the reflective electrode film 292, a color coordinate of the OLED device 100 may be readily controlled. The reflective electrode film 292 may serve as the light reflection layer. The reflective electrode film 292 may reflect a light emitted from the light emitting layer 330 in the front (e.g., fourth direction D4) of the OLED device 100. Thus, the lower electrode 290 including the reflective electrode film 292 may be substantially opaque. Alternatively, the lower electrode 290 may have a multilayer structure including the first transparent electrode film 291 and the reflective electrode film 292, or may have a single layer structure including the reflective electrode film 292. For example, the reflective electrode film 292 may be formed of a metal, a metal alloy, metal nitride, conductive metal oxide, transparent conductive materials, etc. Each of the first transparent electrode film 291 and the second transparent electrode film 293 may be substantially transparent. For example, each of the first transparent electrode film 291 and the second transparent electrode film 293 may include transparent conductive materials, etc.

Referring again to FIGS. 2 and 3, the protection pattern 380 may be disposed on the lower electrode 290 and a portion of the planarization layer 270. In example embodiments, the protection pattern 380 may completely surround the lower electrode 290 such that the lower electrode 290 is not exposed. For example, a lower surface of the lower electrode 290 may be in directly contact with an upper surface of the planarization layer 270, and an upper surface of the lower electrode 290 may be in directly contact with a lower surface of the protection pattern 380. A portion of the protection pattern 380 may be in directly contact with an upper surface of the planarization layer 270. As the protection pattern 380 completely covers the lower electrode 290, the protection pattern 380 may protect the lower electrode 290 from etchants that are used in a forming process of the pixel defining layer 310. In example embodiments, as a thickness of the protection pattern 380 is controlled, the protection pattern 380 and the second transparent electrode film 293 may control the color coordinate of the OLED device 100. In addition, the protection pattern 380 and the boundary pattern 360 may be simultaneously formed by using the same materials. The protection pattern 380 may be formed of transparent conductive materials, etc. The protection pattern 380 may include ZnOx, SnOx, InOx, GaOx, ITO, IZO, etc. Alternatively, the protection pattern 380 and the boundary pattern 360 may be formed of different materials to each other, and may not be simultaneously formed.

The boundary pattern 360 may be in simultaneously (or concurrently) contact with both a sidewall (e.g., a sidewall of the first opening) of the planarization layer 270 and an upper surface of the gate insulation layer 150 in a boundary of the sub-pixel region 10 and the transparent region 20. In example embodiments, the boundary pattern 360 may include a first boundary extension and a second boundary extension. The first boundary extension may extend in a direction (e.g., the first direction D1) from the boundary of the sub-pixel and transparent regions 10 and 20 into the sub-pixel region 10 such that the first boundary extension is disposed in a portion of the sidewall of the planarization layer 270. The second boundary extension may extend in a direction (e.g., the second direction D2) from the boundary of the sub-pixel and transparent regions 10 and 20 into the transparent region 20 such that the second boundary extension is disposed in a portion of an upper surface of the gate insulation layer 150 that is located in transparent region 20 on the substrate 110. For example, the first boundary extension may be disposed in the sub-pixel region 10, and the second boundary extension may be disposed in a portion of the sub-pixel region 10 and a portion of the transparent region 20. In addition, the first boundary extension may be parallel to a sidewall of the planarization layer 270, and the second boundary extension may be parallel to an upper surface of the gate insulation layer 150. The first boundary extension and the second boundary extension may be integrally formed, and the boundary pattern 360 may cover a portion (e.g., a point of contact) where a sidewall of the planarization layer 270, a lower surface of the planarization layer 270, and an upper surface of the gate insulation layer 150 are simultaneously contacted. That is, the boundary pattern 360 may be in simultaneously contact with both a sidewall of the planarization layer 270 and an upper surface of the gate insulation layer 150, and may extend along a boundary of the sub-pixel region 10 and the transparent region 20 (e.g., along the third direction) (refer to FIG. 1). In addition, the boundary pattern 360 may have a substantially hinge shape. For example, in a boundary of the sub-pixel region 10 and the transparent region 20, the boundary pattern 360 may prevent that water or moisture is permeated through an interface between the planarization layer 270 and the gate insulation layer 150. In addition, since the pixel defining layer 310 is disposed on the boundary pattern 360, the pixel defining layer 310 may not be in directly contact with the gate insulation layer 150. In example embodiments, the boundary pattern 360 and the gate electrode 170 may be located at the same level, and the boundary pattern 360 may have the third thickness. In addition, the boundary pattern 360 and the protection pattern 380 may be simultaneously formed by using the same material. For example, the boundary pattern 360 may include ZnOx, SnOx, InOx, GaOx, ITO, IZO, etc. Alternatively, the boundary pattern 360 and the protection pattern 380 may be formed of different materials to each other, and may not be simultaneously formed.

The pixel defining layer 310 may be disposed on the protection pattern 380, the planarization layer 270, and the boundary pattern 360 such that the pixel defining layer 310 exposes the gate insulation layer 150 that is located in the transparent region 20. In example embodiments, the pixel defining layer 310 may expose at least a portion of an upper surface of the boundary pattern 360 in a boundary of the sub-pixel region 10 and the transparent region 20. For example, the pixel defining layer 310 may cover both lateral portions of the protection pattern 380, a sidewall of a first opening of the planarization layer 270 (e.g., a sidewall of the planarization layer 270), and at least a portion of an upper surface of the boundary pattern 360. That is, the pixel defining layer 310 may not be in directly contact with the gate insulation layer 150. The pixel defining layer 310 may have a second opening exposing the gate insulation layer 150 that is located in the transparent region 20 on the substrate 110. A size of the second opening may be less than that of the first opening, and the second opening may be a transparent window illustrated in FIG. 1. The light emitting layer 330 may be disposed on a portion of the protection pattern 380 that is exposed by the pixel defining layer 310. The pixel defining layer 310 may be formed of organic materials or inorganic materials. In example embodiments, the pixel defining layer 310 may include organic materials such as a photoresist, a polyacryl-based resin, a polyimide-based resin, a polyamide-based resin, a siloxane-based resin, an acryl-based resin, an epoxy-based resin, etc.

The light emitting layer 330 may be disposed on a portion of the protection pattern 380 that is exposed by the pixel defining layer 310. The light emitting layer 330 may be formed using at least one of light emitting materials capable of generating different colors of light (e.g., a red color of light, a blue color of light, and a green color of light, etc) according to first through third sub-pixels illustrated in FIG. 1. Alternately, the light emitting layer 330 may generally generate a white color of light by stacking a plurality of light emitting materials capable of generating different colors of light such as a red color of light, a green color of light, a blue color of light, etc. In this case, a color filter may be disposed on the light emitting layer 330, and may not be disposed in the transparent region 20. The color filter may include at least one selected from a red color filter, a green color filter, a blue color filter. Alternatively, the color filter may include a yellow color filter, cyan color filter, and magenta color filter. The color filter may be formed of a photosensitive resin (or color photoresist), etc.

The upper electrode 340 may be disposed in the sub-pixel region 10 on the pixel defining layer 310 and the light emitting layer 330, and may expose the gate insulation layer 150 that is located in the transparent region 20 on the substrate 110. The upper electrode 340 may be formed of a metal, a metal alloy, metal nitride, conductive metal oxide, transparent conductive materials, etc. Accordingly, the sub-pixel structure may be disposed.

The encapsulation substrate 350 may be disposed on the upper electrode 340. The encapsulation substrate 350 and the substrate 110 may include substantially the same materials. For example, the encapsulation substrate 350 may include quartz, synthetic quartz, calcium fluoride, fluoride-doping quartz, sodalime glass, non-alkali glass etc. In some example embodiments, the encapsulation substrate 350 may include a transparent inorganic material or flexible plastic. For example, the encapsulation substrate 350 may include a flexible transparent resin substrate. In this case, to increase flexibility of the OLED device 100, the encapsulation substrate 350 may include a stacked structure where at least one inorganic layer and at least one organic layer are alternately stacked.

The OLED device 100 in accordance with example embodiments includes the boundary pattern 360 and the protection pattern 380. As the protection pattern 380 completely covers the lower electrode 290, the protection pattern 380 may protect the lower electrode 290 from etchants used in a forming process of the pixel defining layer 310. In addition, as the boundary pattern 360 is simultaneously contacted with both a sidewall of the planarization layer 270 and an upper surface of the gate insulation layer 150 in a boundary of the sub-pixel region 10 and the transparent region 20, the pixel defining layer 310 including organic materials may not be directly contacted with the gate insulation layer 150 including inorganic materials. That is, the pixel defining layer 310 may be contacted with an upper surface of the boundary pattern 360 formed of transparent conductive materials that has a good adhesion with the pixel defining layer 310 than the gate insulation layer 150, and the boundary pattern 360 may prevent water or moisture from permeating into the semiconductor element 250 and the sub-pixel structure via an interface between the pixel defining layer 310 and the gate insulation layer 150 (or between the planarization layer 270 and the gate insulation layer 150) in a boundary of the sub-pixel region 10 and the transparent region 20. Accordingly, the interface between the pixel defining layer 310 and the gate insulation layer 150 may be prevented from being detached and, thus, dark pixels in the OLED device may be prevented.

FIGS. 5 through 13 are cross-sectional views illustrating a method of manufacturing a display device in accordance with example embodiments.

Figure 5:
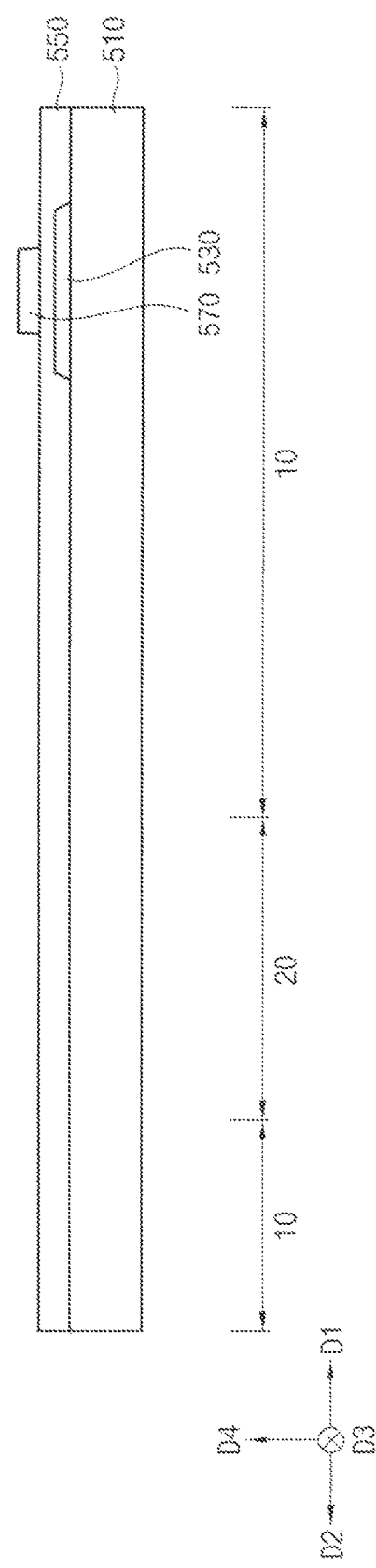
FIGS. 5, 6, 7, 8, 9, 10, 11, 12, and 13 are cross-sectional views illustrating a method of manufacturing an OLED device in accordance with example embodiments.

Referring to FIG. 5, a substrate 510 may be provided. The substrate 510 may formed using a quartz substrate, a synthetic quartz substrate, a calcium fluoride substrate, a fluoride-doping quartz substrate, a sodalime substrate, a non-alkali substrate etc. A buffer layer (not shown) may be formed on the substrate 510. The buffer layer may be formed on the entire substrate 510, and the buffer layer may prevent the diffusion of metal atoms and/or impurities from the substrate 510. The buffer layer may be formed using organic materials or inorganic materials.

An active layer 530 may be formed in a sub-pixel region 10 on the substrate 510. The active layer 530 may be formed using an oxide semiconductor, an inorganic semiconductor, an organic semiconductor, etc. A gate insulation layer 550 may be formed on the active layer 530. The gate insulation layer 550 may cover the active layer 530 in the sub-pixel region 10 on the substrate 510, and may be formed on the entire substrate 510. For example, the gate insulation layer 550 may sufficiently cover the active layer 530, and may have a substantially even surface without a step around the active layer 530. Alternatively, the gate insulation layer 550 may cover the active layer 530, and may be formed as a substantially uniform thickness along a profile of the active layer 530. The gate insulation layer 550 may be formed of a silicon compound, a metal oxide, etc. For example, the gate insulation layer 550 may be formed using SiOx, SiNx, SiOxNy, SiOxCy, SiCxNy, AlOx, AlNx, TaOx, HfOx, ZrOx, TiOx, etc. In example embodiments, the gate insulation layer 550 may include inorganic materials.

A gate electrode 570 may be formed on the gate insulation layer 150. The gate electrode 570 may be formed on the active layer 530 to overlap the active layer 530 in the sub-pixel region 10. The gate electrode 570 may be formed of a metal, a metal alloy, metal nitride, conductive metal oxide, transparent conductive materials, etc. For example, the gate electrode 570 may be formed using Al, an alloy of aluminum, AlNx, Ag, an alloy of silver, W, WNx, Cu, an alloy of copper, Ni, Cr, CrNx, Mo, an alloy of molybdenum, Ti, TiNx, Pt, Ta, TaNx, Nd, Sc, SRO, ZnOx, SnOx, InOx, GaOx, ITO, IZO, etc. These may be used alone or in a suitable combination thereof. Alternatively, the gate electrode 570 may be formed in a multilayer structure.

Figure 6:
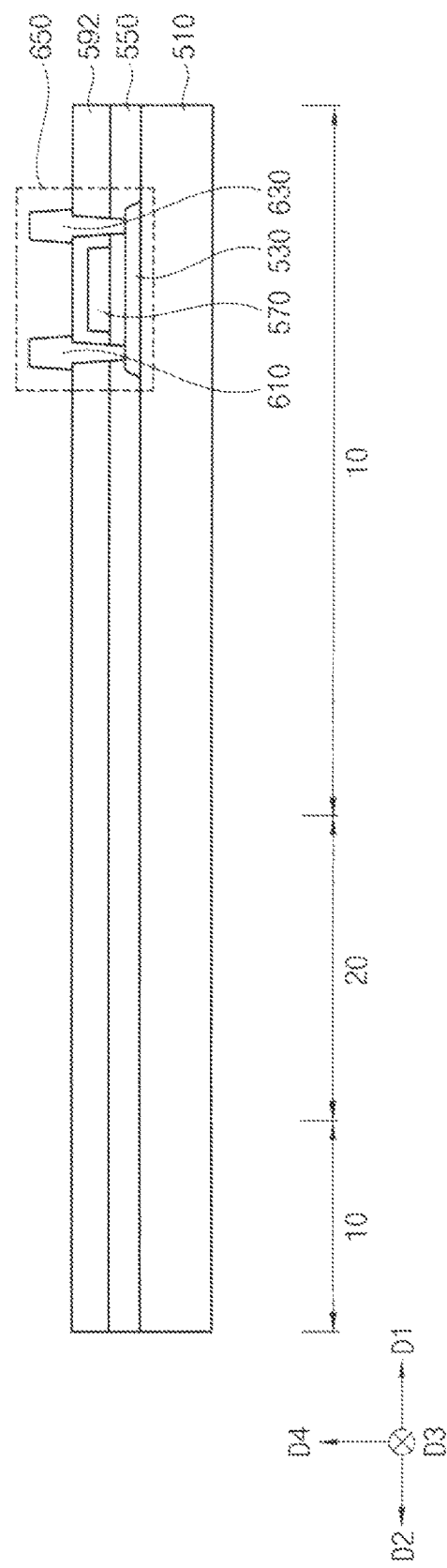

Referring to FIG. 6, a preliminary insulating interlayer 592 may be formed on the gate electrode 570. The preliminary insulating interlayer 592 may cover the gate electrode 570 in the sub-pixel region 10, and may be formed on the entire gate insulation layer 550. For example, the preliminary insulating interlayer 592 may sufficiently cover the gate electrode 570, and may have a substantially even surface without a step around the gate electrode 570. Alternatively, the preliminary insulating interlayer 592 may cover the gate electrode 570, and may be formed as a substantially uniform thickness along a profile of the gate electrode 570. The preliminary insulating interlayer 592 may be formed using a silicon compound, a metal oxide, etc.

A source electrode 610 and a drain electrode 630 may be formed on preliminary insulating interlayer 592. The source electrode 630 may be in contact with a first side of the active layer 530 via a contact hole formed by removing a portion of the gate insulation layer 550 and the preliminary insulating interlayer 592. The drain electrode 630 may be in contact with a second side of the active layer 530 via a contact hole formed by removing a portion of the gate insulation layer 550 and the preliminary insulating interlayer 592. Each of the source electrode 610 and the drain electrode 630 may be formed using a metal, an alloy, metal nitride, conductive metal oxide, transparent conductive materials, etc. These may be used alone or in a suitable combination thereof. Accordingly, a semiconductor element 650 including the active layer 530, the gate insulation layer 550, the gate electrode 570, the preliminary insulating interlayer preliminary insulating interlayer 592, the source electrode 610, and the drain electrode 630 may be formed.

Figure 7:
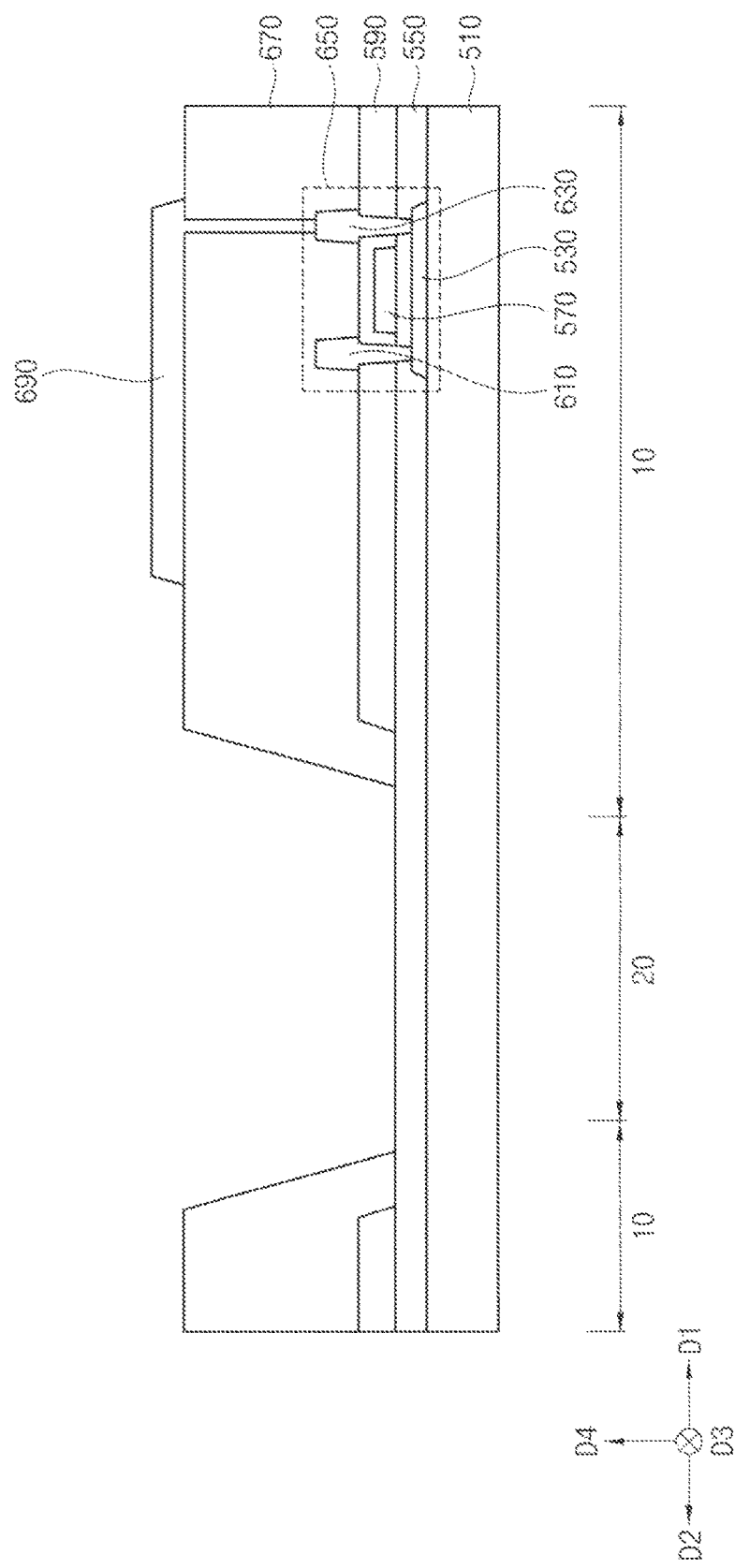
Figure 8:
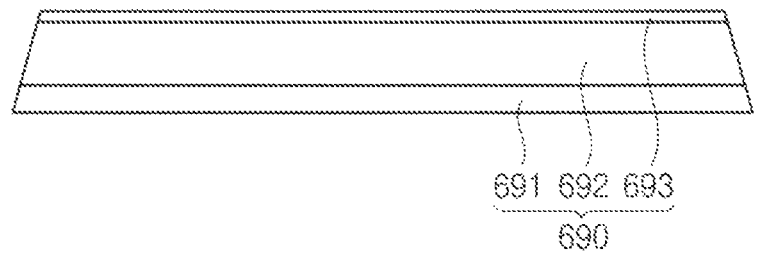

Referring to FIGS. 7 and 8, an insulating interlayer 590 may be formed by partially removing the preliminary insulating interlayer 592 in a region corresponding to the transparent region 20. The insulating interlayer 590 may be formed in the sub-pixel region 10, and may expose a portion of the gate insulation layer 550 that is located on the substrate 510 in the transparent region 20.

A planarization layer 670 may be formed on a portion of the gate insulation layer 550, the insulating interlayer 590, the source electrode 610, and the drain electrode 630. The planarization layer 670 may have a first opening exposing the gate insulation layer 550 in a transparent region 20. For example, the planarization layer 670 may be formed as a relatively high thickness to sufficiently cover the insulating interlayer 590, the source electrode 610, and the drain electrode 630. In this case, the planarization layer 670 may have a substantially even upper surface, and a planarization process may be further performed on the planarization layer 670 to implement the even upper surface of the planarization layer 670. The planarization layer 670 may include organic materials or inorganic materials. In example embodiments, the planarization layer 670 may be formed of organic materials. For example, the planarization layer 670 may be formed using a photoresist, a polyacryl-based resin, a polyimide-based resin, a polyamide-based resin, a siloxane-based resin, an acryl-based resin, an epoxy-based resin, etc.

A lower electrode 690 may be formed in the sub-pixel region 10 on the planarization layer 670. For example, after a preliminary lower electrode may be entirely formed on the gate insulation layer 550 and the planarization layer 670, the lower electrode 690 illustrated in FIGS. 7 and 8 may be formed by partially removing the preliminary lower electrode. The lower electrode 690 may be in contact with the drain electrode 630 to fill contact hole formed by removing portions of the planarization layer 670. In addition, the lower electrode 690 may be electrically connected to the semiconductor element 650.

The lower electrode 690 may have a multilayer structure. The multilayer structure may include a first transparent electrode film 691, a reflective electrode film 692, and a second transparent electrode film 693. That is, the first transparent electrode film 691 may be formed in the sub-pixel region 10 on the planarization layer 270, and the reflective electrode film 692 and the second transparent electrode film 693 may be sequentially formed on the first transparent electrode film 691. For example, after a preliminary first transparent electrode film, a preliminary reflective electrode film, and a preliminary second transparent electrode film may be sequentially and entirely formed on the gate insulation layer 550 and the planarization layer 670, the first transparent electrode film 691, the reflective electrode film 692, and the second transparent electrode film 693 that are illustrated in FIG. 8 may be formed by partially removing each of the preliminary first transparent electrode film, the preliminary reflective electrode film, and the preliminary second transparent electrode film. Here, the first transparent electrode film 691 may have a first thickness, and the first thickness may be about 100 angstroms. The reflective electrode film 692 may have a second thickness that is greater than the first thickness, and the second thickness may be about 1000 angstroms. The second transparent electrode film 693 may have a third thickness that is less than the first thickness, and the third thickness may be about 75 angstroms. The first transparent electrode film 691 and the second transparent electrode film 693 may include substantially the same materials, and the reflective electrode film 692 may be interposed between the first transparent electrode film 691 and the second transparent electrode film 693.

The first transparent electrode film 691 may cover an uneven upper surface of the planarization layer 670. As the first transparent electrode film 691 is formed on the planarization layer 670, the first transparent electrode film 691 may help the formation of the reflective electrode film 692. As the second transparent electrode film 693 is formed on the reflective electrode film 692, a color coordinate of the OLED device may be readily controlled. The reflective electrode film 692 may be formed in a relatively high thickness to reflect a light. Thus, the lower electrode 690 including the reflective electrode film 692 may be substantially opaque. The reflective electrode film 692 may be formed using a metal, a metal alloy, metal nitride, conductive metal oxide, transparent conductive materials, etc. In addition, each of the first transparent electrode film 691 and the second transparent electrode film 693 may be substantially transparent. For example, each of the first transparent electrode film 691 and the second transparent electrode film 693 may be formed using transparent conductive materials, etc.

Figure 9:
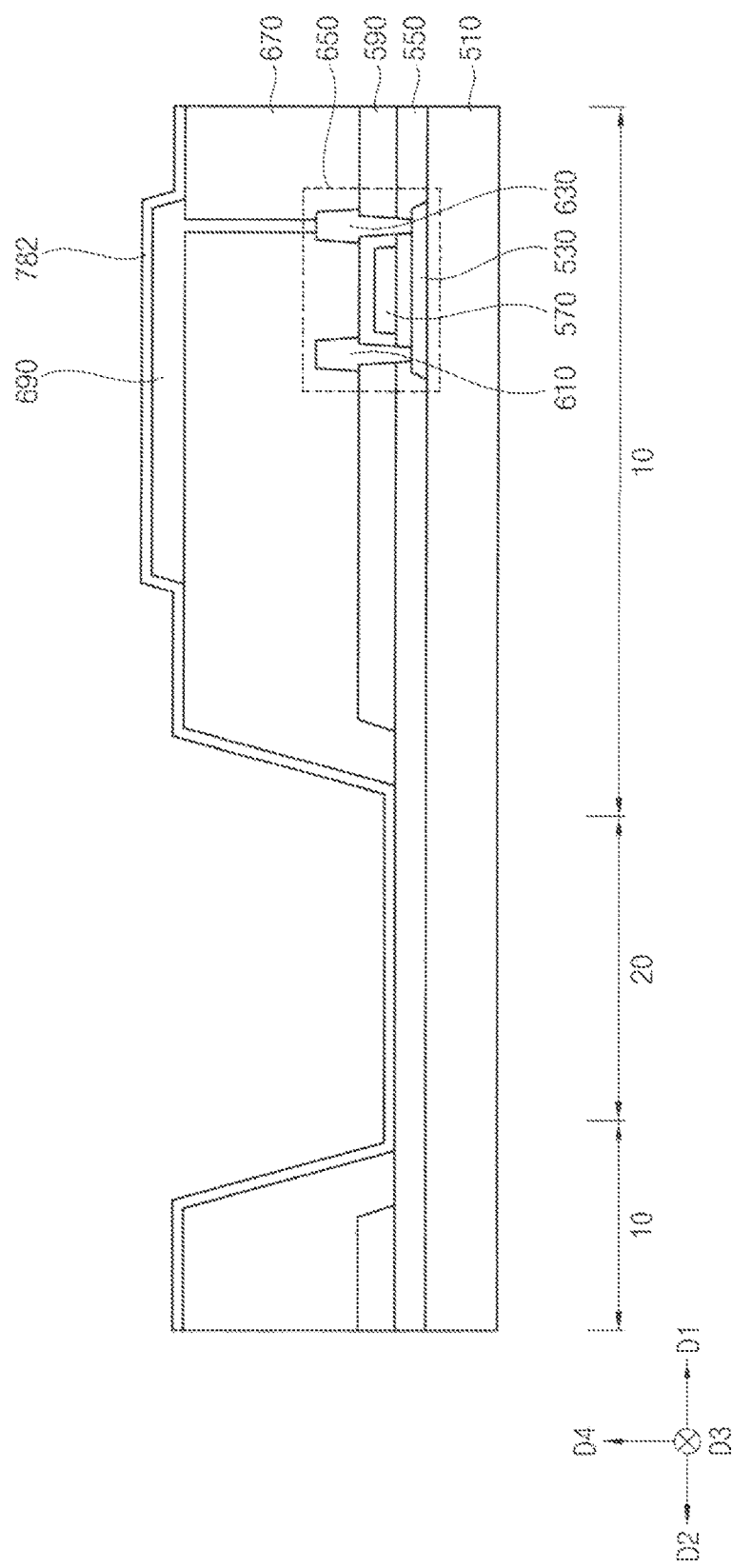
Figure 10:
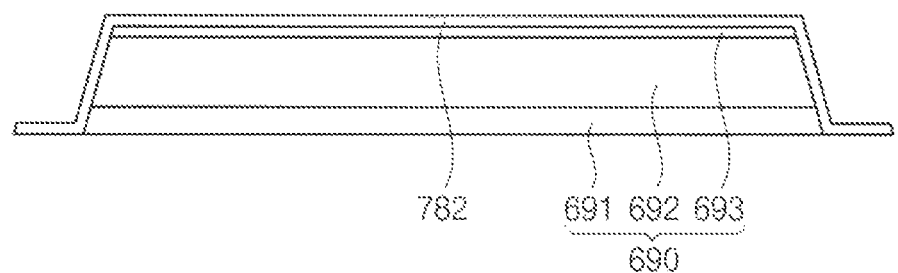

Referring to FIGS. 9 and 10, a preliminary protection pattern 782 may be entirely formed on the gate insulation layer 550, the planarization layer 670, and the lower electrode 690. In example embodiments, the preliminary protection pattern 782 and the second transparent electrode film 693 may be formed in the third thickness by using the same materials. The preliminary protection pattern 782 may be formed of transparent conductive materials, etc. The preliminary protection pattern 782 may be formed using ZnOx, SnOx, InOx, GaOx, ITO, IZO, etc.

Figure 11:
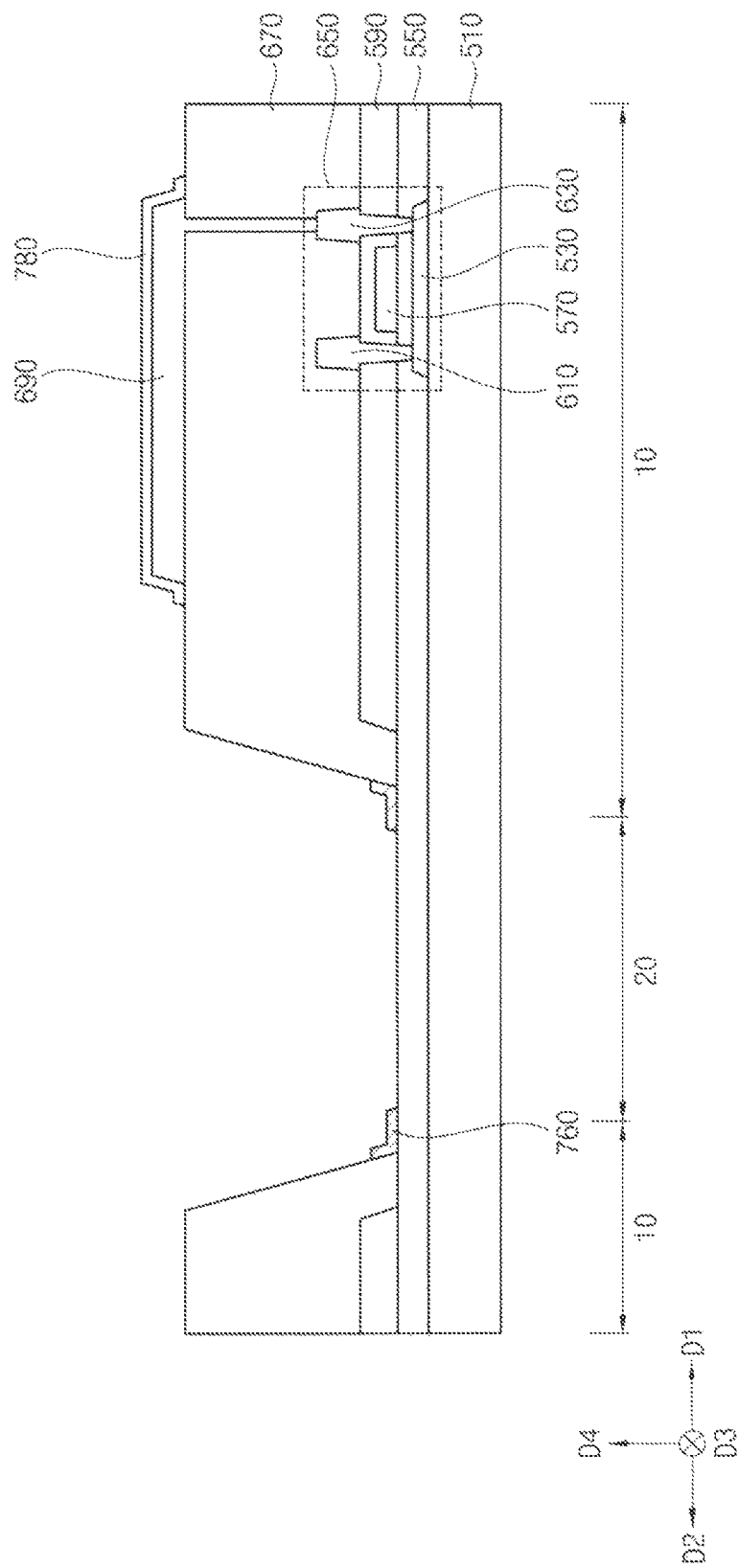
Figure 12:
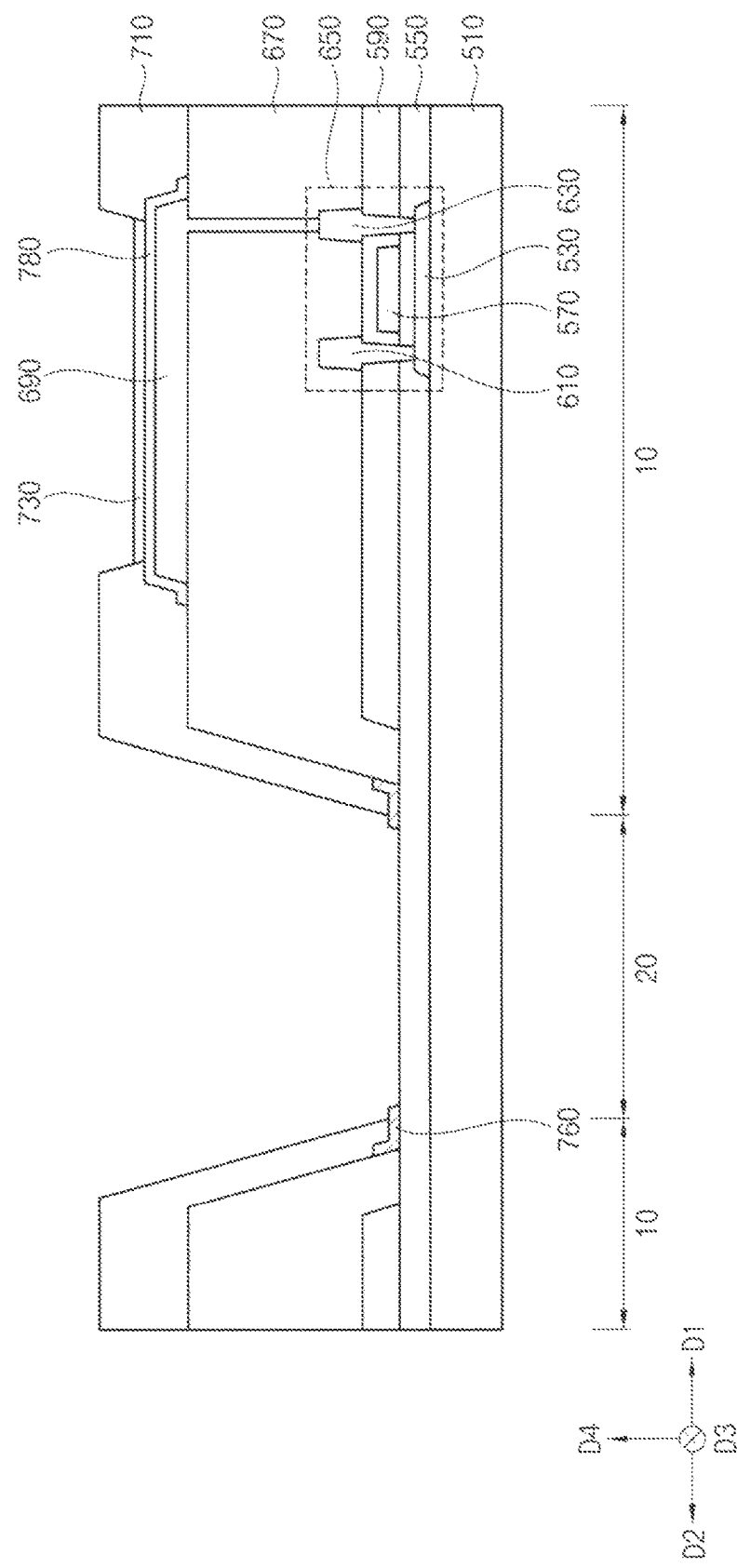

Referring to FIG. 11, a protection pattern 780 and a boundary pattern 760 may be formed by partially removing the preliminary protection pattern 782. The protection pattern 780 may be formed in the sub-pixel region 10 on the planarization layer 670, and may completely surround the lower electrode 690 such that the lower electrode 690 is not exposed. For example, a lower surface of the lower electrode 690 may be in directly contact with an upper surface of the planarization layer 670, and an upper surface of the lower electrode 690 may be in directly contact with a lower surface of the protection pattern 780. A portion of the protection pattern 780 may be in directly contact with an upper surface of the planarization layer 680.

A boundary pattern 760 may be in simultaneously (or concurrently) contact with both a sidewall (e.g., a sidewall of the first opening) of the planarization layer 670 and an upper surface of the gate insulation layer 550 in a boundary of the sub-pixel region 10 and the transparent region 20. The boundary pattern 760 may cover a portion (e.g., a point of contact) where a sidewall of the planarization layer 670, a lower surface of the planarization layer 670, and an upper surface of the gate insulation layer 550 are simultaneously contacted. That is, the boundary pattern 760 may be in simultaneously contact with both a sidewall of the planarization layer 670 and an upper surface of the gate insulation layer 550, and may extend along a boundary of the sub-pixel region 10 and the transparent region 20 (e.g., along the third direction) (refer to FIG. 1). In addition, the boundary pattern 760 may have a substantially hinge shape.

In example embodiments, the boundary pattern 760 and the protection pattern 780 may be simultaneously formed by using the same material. For example, each of the boundary pattern 760 and the protection pattern 780 may be formed using ZnOx, SnOx, InOx, GaOx, ITO, IZO, etc.

A pixel defining layer 710 may be formed on the protection pattern 780, the planarization layer 670, and the boundary pattern 760 such that the pixel defining layer 710 exposes the gate insulation layer 550 that is located in the transparent region 20. In example embodiments, the pixel defining layer 710 may expose at least a portion of an upper surface of the boundary pattern 760 in a boundary of the sub-pixel region 10 and the transparent region 20. For example, the pixel defining layer 710 may cover both lateral portions of the protection pattern 780, a sidewall of a first opening of the planarization layer 670 (e.g., a sidewall of the planarization layer 270), and at least a portion of an upper surface of the boundary pattern 760. That is, the pixel defining layer 710 may not be in directly contact with the gate insulation layer 550. The pixel defining layer 710 may have a second opening exposing the gate insulation layer 550 that is located in the transparent region 20 on the substrate 510. A size of the second opening may be less than that of the first opening, and the second opening may be a transparent window illustrated in FIG. 1. The pixel defining layer 710 may be formed of organic materials or inorganic materials. In example embodiments, the pixel defining layer 710 may include organic materials, and may be formed using a photoresist, a polyacryl-based resin, a polyimide-based resin, a polyamide-based resin, a siloxane-based resin, an acryl-based resin, an epoxy-based resin, etc.

A light emitting layer 730 may be formed on a portion of the protection pattern 780 that is exposed by the pixel defining layer 710. The light emitting layer 730 may be formed using at least one of light emitting materials capable of generating different colors of light (e.g., a red color of light, a blue color of light, and a green color of light, etc) according to first through third sub-pixels illustrated in FIG. 1. Alternately, the light emitting layer 730 may generally generate a white color of light by stacking a plurality of light emitting materials capable of generating different colors of light such as a red color of light, a green color of light, a blue color of light, etc. In this case, a color filter may be disposed on the light emitting layer 730, and may not be disposed in the transparent region 20. The color filter may include at least one selected from a red color filter, a green color filter, a blue color filter. Alternatively, the color filter may include a yellow color filter, cyan color filter, and magenta color filter. The color filter may be formed using a photosensitive resin (or color photoresist), etc.

Figure 13:
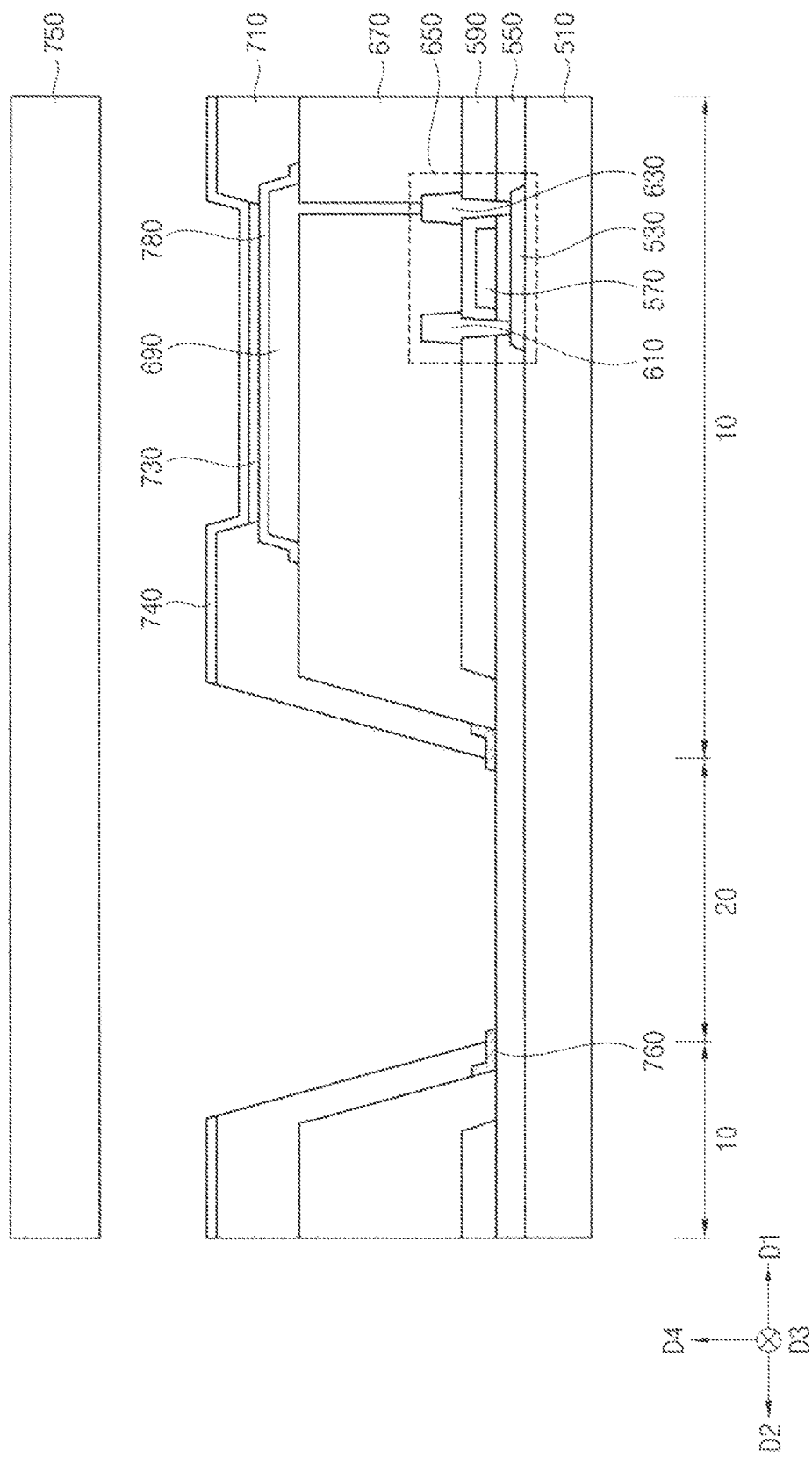

Referring to FIG. 13, an upper electrode 740 may be formed in the sub-pixel region 10 on the pixel defining layer 710 and the light emitting layer 730, and may expose the gate insulation layer 550 that is located in the transparent region 20 on the substrate 510. The upper electrode 740 may be formed using a metal, a metal alloy, metal nitride, conductive metal oxide, transparent conductive materials, etc. Accordingly, a sub-pixel structure may be formed.

The encapsulation substrate 750 may be formed on the upper electrode 740. The encapsulation substrate 750 and the substrate 510 may include substantially the same materials. For example, the encapsulation substrate 750 may be formed using quartz, synthetic quartz, calcium fluoride, fluoride-doping quartz, sodalime glass, non-alkali glass etc. In some example embodiments, the encapsulation substrate 750 may include a transparent inorganic material or flexible plastic. For example, the encapsulation substrate 750 may include a flexible transparent resin substrate. In this case, to increase flexibility of the OLED device, the encapsulation substrate 750 may include a stacked structure where at least one inorganic layer and at least one organic layer are alternately stacked. Accordingly, the OLED device 100 illustrated in FIG. 2 may be manufactured.

Figure 14:
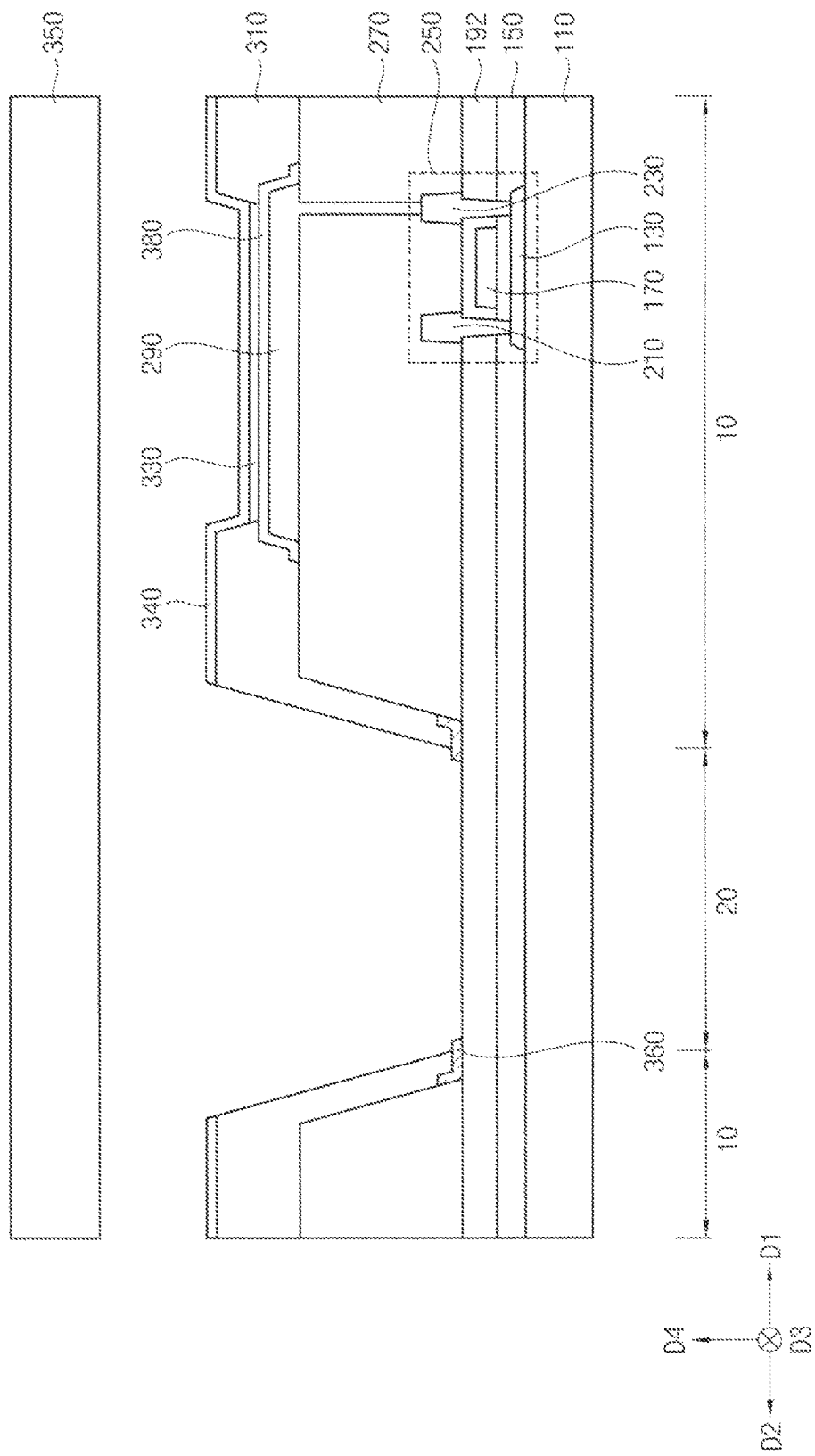
FIG. 14 is a cross-sectional view illustrating the OLED device in accordance with example embodiments.

FIG. 14 is a cross-sectional view illustrating the OLED device in accordance with example embodiments. An OLED device illustrated in FIG. 14 may have a configuration substantially the same as or similar to that of an OLED device 100 described with reference to FIG. 2 except an insulating interlayer 192. In FIG. 14, detailed descriptions for elements, which are substantially the same as or similar to the elements described with reference to FIG. 2, will be omitted.

Referring to FIGS. 2, 3, and 14, an OLED device may include a substrate 110, a semiconductor element 250, a planarization layer 270, a sub-pixel structure, a boundary pattern 360, a protection pattern 380, a pixel defining layer 310, an encapsulation substrate 350, etc. Here, the semiconductor element 250 may include an active layer 130, a gate insulation layer 150, a gate electrode 170, an insulating interlayer 192, a source electrode 210, and a drain electrode 230. The sub-pixel structure may include a lower electrode 290, a light emitting layer 330, and an upper electrode 340. As illustrated in FIG. 3, the lower electrode 290 may include a first transparent electrode film 291, a reflective electrode film 292, and a second transparent electrode film 293.

The insulating interlayer 192 may be disposed on the gate insulation layer 150 and the gate electrode 170. The insulating interlayer 192 may cover the gate electrode 170 in the sub-pixel region 10, and may be disposed in the sub-pixel region 10 and the transparent region 20 on the substrate 110. For example, the insulating interlayer 192 may sufficiently cover the gate electrode 170, and may have a substantially even surface without a step around the gate electrode 170. Alternatively, the insulating interlayer 192 may cover the gate electrode 170, and may be disposed as a substantially uniform thickness along a profile of the gate electrode 170. The insulating interlayer 192 may include a silicon compound, a metal oxide, etc. In example embodiments, the insulating interlayer 192 may be formed of inorganic materials.

The planarization layer 270 may be disposed on the insulating interlayer 192, the source electrode 210, and the drain electrode 230. The planarization layer 270 may have a first opening exposing the insulating interlayer 192 in the transparent region 20. For example, the planarization layer 270 may be disposed as a relatively high thickness to sufficiently cover the source electrode 210, and the drain electrode 230. In this case, the planarization layer 270 may have a substantially even upper surface, and a planarization process may be further performed on the planarization layer 270 to implement the even upper surface of the planarization layer 270. The planarization layer 270 may include organic materials or inorganic materials. In example embodiments, the planarization layer 270 may include organic materials. For example, the planarization layer 270 may be formed of a photoresist, a polyacryl-based resin, a polyimide-based resin, a polyamide-based resin, a siloxane-based resin, an acryl-based resin, an epoxy-based resin, etc.

The boundary pattern 360 may be in simultaneously (or concurrently) contact with both a sidewall (e.g., a sidewall of the first opening) of the planarization layer 270 and an upper surface of the insulating interlayer 192 in a boundary of the sub-pixel region 10 and the transparent region 20. In example embodiments, the boundary pattern 360 may include a first boundary extension and a second boundary extension. The first boundary extension may extend in a direction (e.g., the first direction D1) from the boundary of the sub-pixel and transparent regions 10 and 20 into the sub-pixel region 10 such that the first boundary extension is disposed in a portion of the sidewall of the planarization layer 270. The second boundary extension may extend in a direction (e.g., the second direction D2) from the boundary of the sub-pixel and transparent regions 10 and 20 into the transparent region 20 such that the second boundary extension is disposed in a portion of an upper surface of the insulating interlayer 192 that is located in transparent region 20 on the substrate 110. For example, the first boundary extension may be disposed in the sub-pixel region 10, and the second boundary extension may be disposed in a portion of the sub-pixel region 10 and a portion of the transparent region 20. In addition, the first boundary extension may be parallel to a sidewall of the planarization layer 270, and the second boundary extension may be parallel to an upper surface of the insulating interlayer 192. The first boundary extension and the second boundary extension may be integrally formed, and the boundary pattern 360 may cover a portion (e.g., a point of contact) where a sidewall of the planarization layer 270, a lower surface of the planarization layer 270, and an upper surface of the insulating interlayer 192 are simultaneously contacted. That is, the boundary pattern 360 may be in simultaneously contact with both a sidewall of the planarization layer 270 and an upper surface of the insulating interlayer 192, and may extend along a boundary of the sub-pixel region 10 and the transparent region 20 (e.g., along the third direction) (refer to FIG. 1). In addition, the boundary pattern 360 may have a substantially hinge shape. For example, in a boundary of the sub-pixel region 10 and the transparent region 20, the boundary pattern 360 may prevent that water or moisture is permeated into between the planarization layer 270 and the insulating interlayer 192. In addition, since the pixel defining layer 310 is disposed on the boundary pattern 360, the pixel defining layer 310 may not be in directly contact with the insulating interlayer 192. In example embodiments, the boundary pattern 360, the source electrode 210, and the drain electrode 230 may be located at the same level, and the boundary pattern 360 may have the third thickness. In addition, the boundary pattern 360 and the protection pattern 380 may be simultaneously formed by using the same material. For example, the boundary pattern 360 may include ZnOx, SnOx, InOx, GaOx, ITO, IZO, etc. Alternatively, the boundary pattern 360 and the protection pattern 380 may be formed of different materials to each other, and may not be simultaneously formed.

The pixel defining layer 310 may be disposed on the protection pattern 380, the planarization layer 270, and the boundary pattern 360 such that the pixel defining layer 310 exposes the insulating interlayer 192 that is located in the transparent region 20. In example embodiments, the pixel defining layer 310 may expose at least a portion of an upper surface of the boundary pattern 360 in a boundary of the sub-pixel region 10 and the transparent region 20. For example, the pixel defining layer 310 may cover both lateral portions of the protection pattern 380, a sidewall of a first opening of the planarization layer 270 (e.g., a sidewall of the planarization layer 270), and at least a portion of an upper surface of the boundary pattern 360. That is, the pixel defining layer 310 may not be in directly contact with the insulating interlayer 192. The pixel defining layer 310 may have a second opening exposing the insulating interlayer 192 that is located in the transparent region 20 on the substrate 110. A size of the second opening may be less than that of the first opening, and the second opening may be a transparent window illustrated in FIG. 1. The light emitting layer 330 may be disposed on a portion of the protection pattern 380 that is exposed by the pixel defining layer 310. The pixel defining layer 310 may be formed of organic materials or inorganic materials. In example embodiments, the pixel defining layer 310 may include organic materials such as a photoresist, a polyacryl-based resin, a polyimide-based resin, a polyamide-based resin, a siloxane-based resin, an acryl-based resin, an epoxy-based resin, etc.

Figure 15:
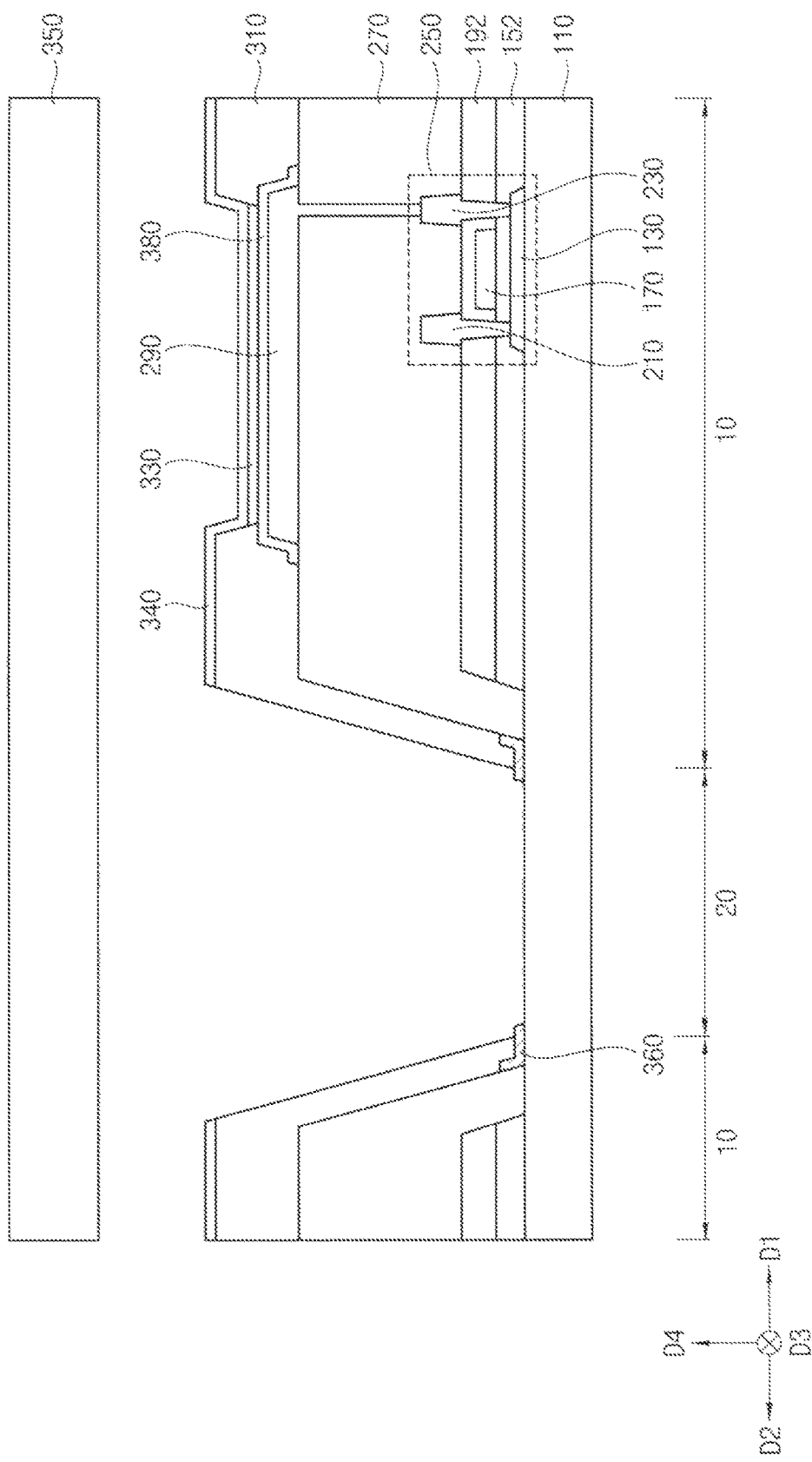
FIG. 15 is a cross-sectional view illustrating the OLED device in accordance with example embodiments.

FIG. 15 is a cross-sectional view illustrating the OLED device in accordance with example embodiments. An OLED device illustrated in FIG. 15 may have a configuration substantially the same as or similar to that of an OLED device 100 described with reference to FIG. 2 except a gate insulation layer 152. In FIG. 15, detailed descriptions for elements, which are substantially the same as or similar to the elements described with reference to FIG. 2, will be omitted.

Referring to FIGS. 2, 3, and 15, an OLED device may include a substrate 110, a semiconductor element 250, a planarization layer 270, a sub-pixel structure, a boundary pattern 360, a protection pattern 380, a pixel defining layer 310, an encapsulation substrate 350, etc. Here, the semiconductor element 250 may include an active layer 130, a gate insulation layer 152, a gate electrode 170, an insulating interlayer 192, a source electrode 210, and a drain electrode 230. The sub-pixel structure may include a lower electrode 290, a light emitting layer 330, and an upper electrode 340. As illustrated in FIG. 3, the lower electrode 290 may include a first transparent electrode film 291, a reflective electrode film 292, and a second transparent electrode film 293.

The gate insulation layer 152 may be disposed on the active layer 130. The gate insulation layer 152 may cover the active layer 130 in the sub-pixel region 10, and may expose an upper surface of the substrate 110 that is located in the transparent region 20. For example, the gate insulation layer 152 may sufficiently cover the active layer 130, and may have a substantially even surface without a step around the active layer 130. Alternatively, the gate insulation layer 152 may cover the active layer 130, and may be disposed as a substantially uniform thickness along a profile of the active layer 130. The gate insulation layer 152 may be formed of a silicon compound, a metal oxide, etc. In example embodiments, the gate insulation layer 152 may be formed of inorganic materials.

The insulating interlayer 192 may be disposed in the sub-pixel region 10 on the gate insulation layer 152 and the gate electrode 170. The insulating interlayer 192 may cover the gate electrode 170 in the sub-pixel region 10, and may expose an upper surface of the substrate 110 that is located in the transparent region 20. For example, the insulating interlayer 192 may sufficiently cover the gate electrode 170, and may have a substantially even surface without a step around the gate electrode 170. Alternatively, the insulating interlayer 190 may cover the gate electrode 170, and may be disposed as a substantially uniform thickness along a profile of the gate electrode 170. The insulating interlayer 190 may include a silicon compound, a metal oxide, etc. In example embodiments, the insulating interlayer 190 may be formed of inorganic materials.

The planarization layer 270 may be disposed on a portion of the substrate 110, the insulating interlayer 192, the source electrode 210, and the drain electrode 230. The planarization layer 270 may have a first opening exposing the substrate 110 in the transparent region 20. For example, the planarization layer 270 may be disposed as a relatively high thickness to sufficiently cover the source electrode 210, and the drain electrode 230. In this case, the planarization layer 270 may have a substantially even upper surface, and a planarization process may be further performed on the planarization layer 270 to implement the even upper surface of the planarization layer 270. The planarization layer 270 may include organic materials or inorganic materials. In example embodiments, the planarization layer 270 may include organic materials.

The boundary pattern 360 may be in simultaneously (or concurrently) contact with both a sidewall (e.g., a sidewall of the first opening) of the planarization layer 270 and an upper surface of the substrate 110 in a boundary of the sub-pixel region 10 and the transparent region 20. In example embodiments, the boundary pattern 360 may include a first boundary extension and a second boundary extension. The first boundary extension may extend in a direction (e.g., the first direction D1) from the boundary of the sub-pixel and transparent regions 10 and 20 into the sub-pixel region 10 such that the first boundary extension is disposed in a portion of the sidewall of the planarization layer 270. The second boundary extension may extend in a direction (e.g., the second direction D2) from the boundary of the sub-pixel and transparent regions 10 and 20 into the transparent region 20 such that the second boundary extension is disposed in a portion of an upper surface of the substrate 110 that is located in transparent region 20. For example, the first boundary extension may be disposed in the sub-pixel region 10, and the second boundary extension may be disposed in a portion of the sub-pixel region 10 and a portion of the transparent region 20. In addition, the first boundary extension may be parallel to a sidewall of the planarization layer 270, and the second boundary extension may be parallel to an upper surface of the substrate 110. The first boundary extension and the second boundary extension may be integrally formed, and the boundary pattern 360 may cover a portion (e.g., a point of contact) where a sidewall of the planarization layer 270, a lower surface of the planarization layer 270, and an upper surface of the substrate 110 are simultaneously contacted. That is, the boundary pattern 360 may be in simultaneously contact with both a sidewall of the planarization layer 270 and an upper surface of the substrate 110, and may extend along a boundary of the sub-pixel region 10 and the transparent region 20 (e.g., along the third direction) (refer to FIG. 1). In addition, the boundary pattern 360 may have a substantially hinge shape. For example, in a boundary of the sub-pixel region 10 and the transparent region 20, the boundary pattern 360 may prevent water or moisture from permeating into an interface between the planarization layer 270 and the substrate 110. In addition, since the pixel defining layer 310 is disposed on the boundary pattern 360, the pixel defining layer 310 may not be in directly contact with the substrate 110. In example embodiments, the boundary pattern 360 and the active layer 130 may be located at the same level, and the boundary pattern 360 may have the third thickness. In addition, the boundary pattern 360 and the protection pattern 380 may be simultaneously formed by using the same material. For example, the boundary pattern 360 may include ZnOx, SnOx, InOx, GaOx, ITO, IZO, etc. Alternatively, the boundary pattern 360 and the protection pattern 380 may be formed of different materials to each other, and may not be simultaneously formed.

The pixel defining layer 310 may be disposed on the protection pattern 380, the planarization layer 270, and the boundary pattern 360 such that the pixel defining layer 310 exposes an upper surface of the substrate 110 that is located in the transparent region 20. In example embodiments, the pixel defining layer 310 may expose at least a portion of an upper surface of the boundary pattern 360 in a boundary of the sub-pixel region 10 and the transparent region 20. For example, the pixel defining layer 310 may cover both lateral portions of the protection pattern 380, a sidewall of a first opening of the planarization layer 270 (e.g., a sidewall of the planarization layer 270), and at least a portion of an upper surface of the boundary pattern 360. That is, the pixel defining layer 310 may not be in directly contact with an upper surface of the substrate 110. The pixel defining layer 310 may have a second opening exposing an upper surface of the substrate 110 that is located in the transparent region 20. A size of the second opening may be less than that of the first opening, and the second opening may be a transparent window illustrated in FIG. 1. The pixel defining layer 310 may be formed of organic materials or inorganic materials. In example embodiments, the pixel defining layer 310 may include organic materials.

As the gate insulation layer 152 and the insulating interlayer 190 that are located in the transparent region 20 are removed, a transmissivity of the transparent region 20 of the OLED device may be relatively increased.

Figure 16:
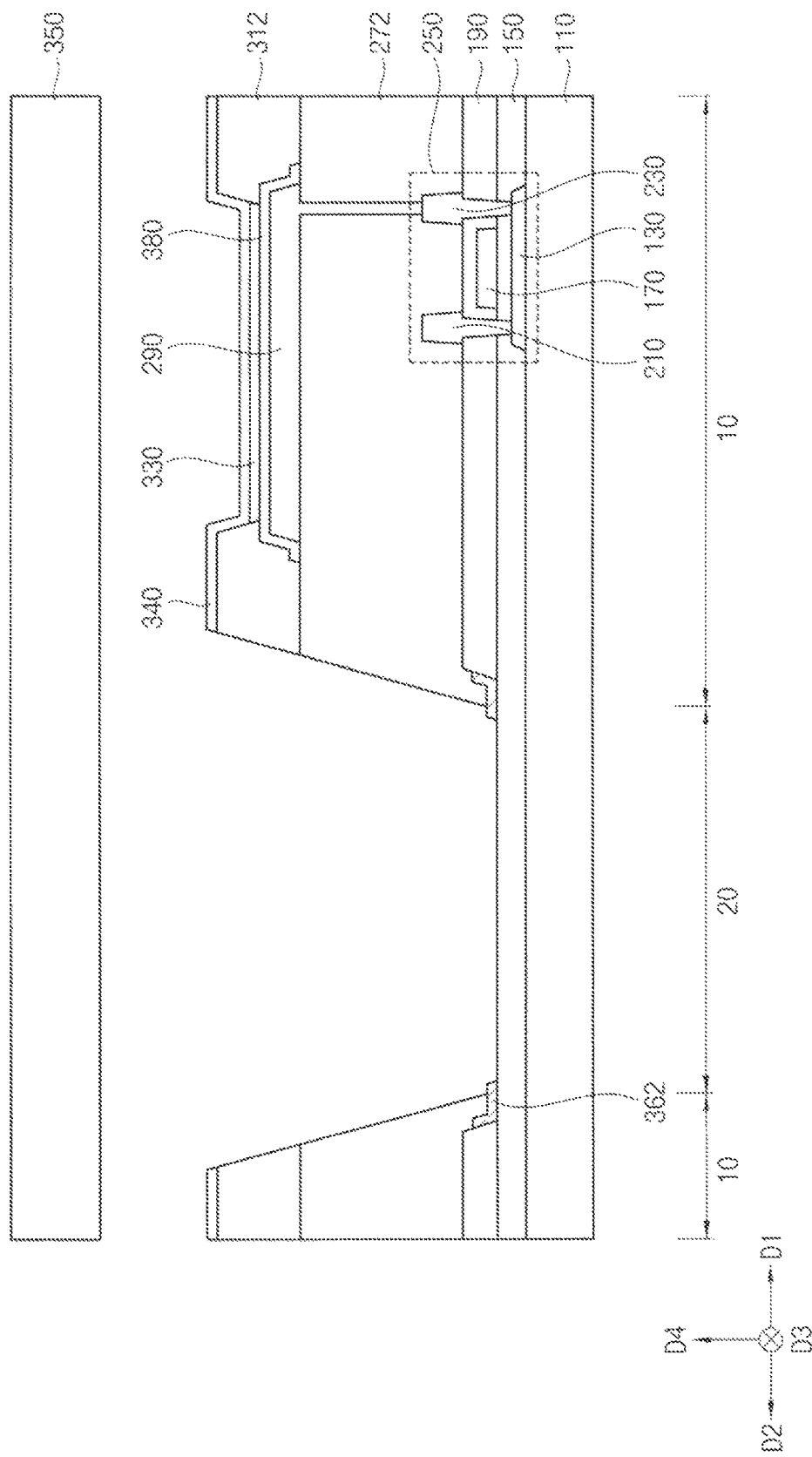
FIG. 16 is a cross-sectional view illustrating the OLED device in accordance with example embodiments.

FIG. 16 is a cross-sectional view illustrating the OLED device in accordance with example embodiments. An OLED device illustrated in FIG. 16 may have a configuration substantially the same as or similar to that of an OLED device 100 described with reference to FIG. 2 except a planarization layer 272, a boundary pattern 362 and a pixel defining layer 312. In FIG. 16, detailed descriptions for elements, which are substantially the same as or similar to the elements described with reference to FIG. 2, will be omitted.

Referring to FIGS. 2, 3, and 16, an OLED device may include a substrate 110, a semiconductor element 250, a planarization layer 272, a sub-pixel structure, a boundary pattern 362, a protection pattern 380, a pixel defining layer 312, an encapsulation substrate 350, etc. Here, the semiconductor element 250 may include an active layer 130, a gate insulation layer 150, a gate electrode 170, an insulating interlayer 190, a source electrode 210, and a drain electrode 230. The sub-pixel structure may include a lower electrode 290, a light emitting layer 330, and an upper electrode 340. As illustrated in FIG. 3, the lower electrode 290 may include a first transparent electrode film 291, a reflective electrode film 292, and a second transparent electrode film 293.

The boundary pattern 362 may be in simultaneously (or concurrently) contact with both a sidewall of the insulating interlayer 190 and an upper surface of the gate insulation layer 150 in a boundary of the sub-pixel region 10 and the transparent region 20. In example embodiments, the boundary pattern 362 may include a first boundary extension and a second boundary extension. The first boundary extension may extend in a direction from the boundary of the sub-pixel and transparent regions 10 and 20 into the sub-pixel region 10 such that the first boundary extension is disposed in a portion of the sidewall of the insulating interlayer 190. The second boundary extension may extend in a direction (e.g., the second direction D2) from the boundary of the sub-pixel and transparent regions 10 and 20 into the transparent region 20 such that the second boundary extension is disposed in a portion of an upper surface of the gate insulation layer 150 that is located in transparent region 20 on the substrate 110. For example, the first boundary extension may be disposed in the sub-pixel region 10, and the second boundary extension may be disposed in a portion of the sub-pixel region 10 and a portion of the transparent region 20. In addition, the first boundary extension may be parallel to a sidewall of the insulating interlayer 190, and the second boundary extension may be parallel to an upper surface of the gate insulation layer 150. The first boundary extension and the second boundary extension may be integrally formed, and the boundary pattern 362 may cover a portion where a sidewall of the insulating interlayer 190, a lower surface of the insulating interlayer 190, and an upper surface of the gate insulation layer 150 are simultaneously contacted. That is, the boundary pattern 362 may be in simultaneously contact with both a sidewall of the insulating interlayer 190 and an upper surface of the gate insulation layer 150, and may extend along a boundary of the sub-pixel region 10 and the transparent region 20 (refer to FIG. 1). In addition, the boundary pattern 362 may have a substantially hinge shape. For example, in a boundary of the sub-pixel region 10 and the transparent region 20, the boundary pattern 362 may prevent water or moisture from permeating into an interface between the insulating interlayer 190 and the gate insulation layer 150. In addition, since the planarization layer 272 and the pixel defining layer 312 are disposed on the boundary pattern 362, the planarization layer 272 and the pixel defining layer 312 may not be in directly contact with the gate insulation layer 150. In example embodiments, the boundary pattern 362 and the gate electrode 170 may be located at the same level, and the boundary pattern 362 may have the third thickness. In addition, the boundary pattern 362 and the protection pattern 380 may be simultaneously formed by using the same material. For example, the boundary pattern 362 may include ZnOx, SnOx, InOx, GaOx, ITO, IZO, etc.

The planarization layer 272 may have a first opening exposing the gate insulation layer 150 in the transparent region 20. The planarization layer 272 may be disposed on the insulating interlayer 190, the source electrode 210, the drain electrode 230, and the boundary pattern 362 such that the planarization layer 272 exposes the gate insulation layer 150 that is located in the transparent region 20. In example embodiments, the planarization layer 272 may expose at least a portion of an upper surface of the boundary pattern 362 in a boundary of the sub-pixel region 10 and the transparent region 20. For example, the planarization layer 272 may cover at least a portion of an upper surface of the boundary pattern 362. That is, the planarization layer 272 may not be in directly contact with the gate insulation layer 150. The planarization layer 272 may include organic materials or inorganic materials. In example embodiments, the planarization layer 272 may be formed of organic materials.

The pixel defining layer 312 may be disposed on the protection pattern 380 and the planarization layer 272 such that the pixel defining layer 310 exposes the gate insulation layer 150 that is located in the transparent region 20. For example, the pixel defining layer 312 may cover both lateral portions of the protection pattern 380, and may be disposed on the planarization layer 272. The pixel defining layer 312 may not cover sidewall of the planarization layer 272 but only cover an upper surface of the planarization layer 272. The pixel defining layer 312 may have a second opening exposing the gate insulation layer 150 that is located in the transparent region 20 on the substrate 110. A size of the second opening may be greater than that of the first opening, and the first and second openings may be a transparent window illustrated in FIG. 1. The pixel defining layer 312 may be formed of organic materials or inorganic materials. In example embodiments, the pixel defining layer 310 may include organic materials. The first opening and the second opening may be formed using a same mask.

As the pixel defining layer 312 is disposed on the planarization layer 272, a size of a transparent window included in the OLED device may be relatively increased.

Figure 17:
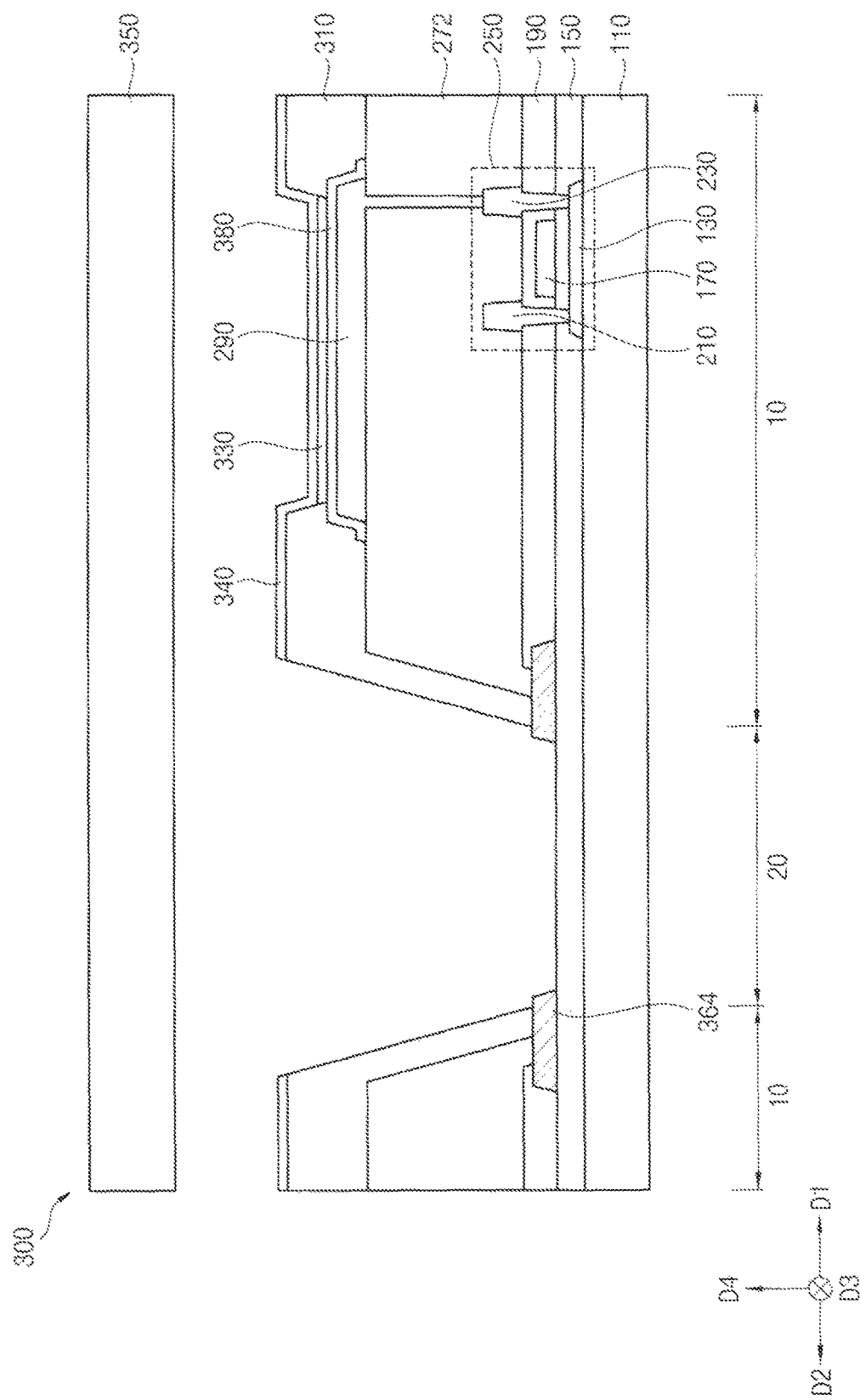
FIG. 17 is a cross-sectional view illustrating the OLED device in accordance with example embodiments.

FIG. 17 is a cross-sectional view illustrating the OLED device in accordance with example embodiments. An OLED device 300 illustrated in FIG. 17 may have a configuration substantially the same as or similar to that of an OLED device 100 described with reference to FIG. 2 except a boundary pattern 364 and a planarization layer 272. In FIG. 17, detailed descriptions for elements, which are substantially the same as or similar to the elements described with reference to FIG. 2, will be omitted.

Referring to FIGS. 2, 3, and 17, an OLED device 300 may include a substrate 110, a semiconductor element 250, a planarization layer 272, a sub-pixel structure, a boundary pattern 364, a protection pattern 380, a pixel defining layer 310, an encapsulation substrate 350, etc. Here, the semiconductor element 250 may include an active layer 130, a gate insulation layer 150, a gate electrode 170, an insulating interlayer 190, a source electrode 210, and a drain electrode 230. The sub-pixel structure may include a lower electrode 290, a light emitting layer 330, and an upper electrode 340. As illustrated in FIG. 3, the lower electrode 290 may include a first transparent electrode film 291, a reflective electrode film 292, and a second transparent electrode film 293.

The boundary pattern 364 may be in simultaneously contact with both a lower surface of the insulating interlayer 190 and an upper surface of the gate insulation layer 150 in a boundary of the sub-pixel region 10 and the transparent region 20. In example embodiments, the boundary pattern 364 may extend in a direction from a sidewall of the insulating interlayer 190 into the transparent region 20 on the gate insulation layer 150. For example, the boundary pattern 364 may be disposed in a boundary of the sub-pixel region 10 and a portion of the transparent region 20. In addition, the boundary pattern 364 may be parallel to an upper surface of the gate insulation layer 150.

The boundary pattern 364 may cover a portion where a lower surface of the insulating interlayer 190 and an upper surface of the gate insulation layer 150 are simultaneously contacted. That is, the boundary pattern 364 may be in simultaneously contact with both a lower surface of the insulating interlayer 190 and an upper surface of the gate insulation layer 150, and may extend along a boundary of the sub-pixel region 10 and the transparent region 20 (refer to FIG. 1). In addition, the boundary pattern 364 may have a substantially athletic track shape. For example, in a boundary of the sub-pixel region 10 and the transparent region 20, the boundary pattern 364 may prevent water or moisture from permeating into an interface between the insulating interlayer 190 and the gate insulation layer 150. In addition, since the planarization layer 272 and the pixel defining layer 310 are disposed on the boundary pattern 364, the planarization layer 272 and the pixel defining layer 310 may not be in directly contact with the gate insulation layer 150. In example embodiments, the boundary pattern 364 and the gate electrode 170 may be located at the same level, and the boundary pattern 364 and the gate electrode 170 may be simultaneously formed by using the same material. For example, the boundary pattern 364 may include a metal, a metal alloy, metal nitride, conductive metal oxide, transparent conductive materials, etc.

The planarization layer 272 may have a first opening exposing the gate insulation layer 150 in the transparent region 20. The planarization layer 272 may be disposed on the insulating interlayer 190, the source electrode 210, the drain electrode 230, and the boundary pattern 364 such that the planarization layer 272 exposes the gate insulation layer 150 that is located in the transparent region 20. In example embodiments, the planarization layer 272 may expose at least a portion of an upper surface of the boundary pattern 364 in a boundary of the sub-pixel region 10 and the transparent region 20. For example, the planarization layer 272 may cover at least a portion of an upper surface of the boundary pattern 364. That is, the planarization layer 272 may not be in directly contact with the gate insulation layer 150. The planarization layer 272 may include organic materials or inorganic materials. In example embodiments, the planarization layer 272 may be formed of organic materials.

The pixel defining layer 310 may be disposed on the protection pattern 380, the planarization layer 270, and the boundary pattern 364 such that the pixel defining layer 310 exposes an upper surface of the gate insulation layer 150 that is located in the transparent region 20. In example embodiments, the pixel defining layer 310 may expose at least a portion of an upper surface of the boundary pattern 364 in a boundary of the sub-pixel region 10 and the transparent region 20. For example, the pixel defining layer 310 may cover both lateral portions of the protection pattern 380, a sidewall of a first opening of the planarization layer 272 (e.g., a sidewall of the planarization layer 272), and at least a portion of an upper surface of the boundary pattern 364. That is, the pixel defining layer 310 may not be in directly contact with an upper surface of the substrate 110. The pixel defining layer 310 may have a second opening exposing an upper surface of the gate insulation layer 150 that is located in the transparent region 20. A size of the second opening may be less than that of the first opening, and the second opening may be a transparent window illustrated in FIG. 1. The pixel defining layer 310 may be formed of organic materials or inorganic materials. In example embodiments, the pixel defining layer 310 may include organic materials.

As the boundary pattern 364 and the gate electrode 170 are simultaneously formed using the same materials, a manufacturing cost of the OLED device 300 may be decreased.

Figure 18:
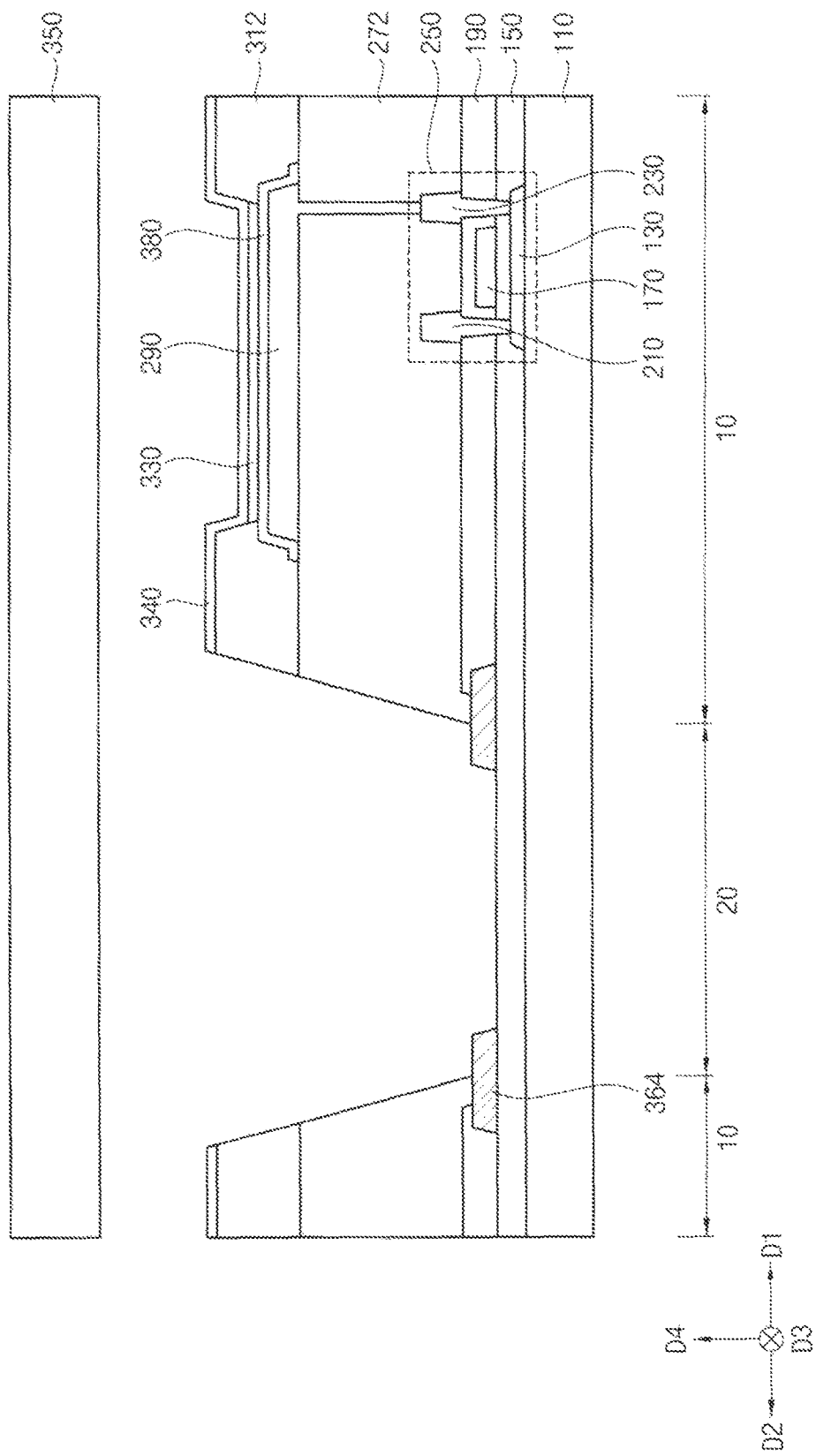
FIG. 18 is a cross-sectional view illustrating the OLED device in accordance with example embodiments.

FIG. 18 is a cross-sectional view illustrating the OLED device in accordance with example embodiments. An OLED device illustrated in FIG. 18 may have a configuration substantially the same as or similar to that of an OLED device 100 described with reference to FIG. 2 except a boundary pattern 364, a planarization layer 272, and a pixel defining layer 312. In FIG. 18, detailed descriptions for elements, which are substantially the same as or similar to the elements described with reference to FIG. 2, will be omitted.

Referring to FIGS. 2, 3, and 18, an OLED device may include a substrate 110, a semiconductor element 250, a planarization layer 272, a sub-pixel structure, a boundary pattern 364, a protection pattern 380, a pixel defining layer 312, an encapsulation substrate 350, etc. Here, the semiconductor element 250 may include an active layer 130, a gate insulation layer 150, a gate electrode 170, an insulating interlayer 190, a source electrode 210, and a drain electrode 230. The sub-pixel structure may include a lower electrode 290, a light emitting layer 330, and an upper electrode 340. As illustrated in FIG. 3, the lower electrode 290 may include a first transparent electrode film 291, a reflective electrode film 292, and a second transparent electrode film 293.

The boundary pattern 364 may be in simultaneously contact with both a lower surface of the insulating interlayer 190 and an upper surface of the gate insulation layer 150 in a boundary of the sub-pixel region 10 and the transparent region 20. In example embodiments, the boundary pattern 364 may extend in a direction from a lower surface of the insulating interlayer 190 into the transparent region 20 on the gate insulation layer 150. For example, the boundary pattern 364 may be disposed in a portion of the sub-pixel region 10 and a portion of the transparent region 20. In addition, the boundary pattern 364 may be parallel to an upper surface of the gate insulation layer 150. The boundary pattern 364 may cover a portion where a lower surface of the insulating interlayer 190 and an upper surface of the gate insulation layer 150 are simultaneously contacted. That is, the boundary pattern 364 may be in simultaneously contact with both a lower surface of the insulating interlayer 190 and an upper surface of the gate insulation layer 150, and may extend along a boundary of the sub-pixel region 10 and the transparent region 20 (refer to FIG. 1). In addition, the boundary pattern 364 may have a substantially athletic track shape. For example, in a boundary of the sub-pixel region 10 and the transparent region 20, the boundary pattern 364 may prevent water or moisture from permeating into an interface between the insulating interlayer 190 and the gate insulation layer 150. In addition, since the planarization layer 272 and the pixel defining layer 310 are disposed on the boundary pattern 364, the planarization layer 272 and the pixel defining layer 310 may not be in directly contact with the gate insulation layer 150. In example embodiments, the boundary pattern 364 and the gate electrode 170 may be located at the same level, and the boundary pattern 364 and the gate electrode 170 may be simultaneously formed by using the same material. For example, the boundary pattern 364 may include a metal, a metal alloy, metal nitride, conductive metal oxide, transparent conductive materials, etc.

The planarization layer 272 may have a first opening exposing the gate insulation layer 150 in the transparent region 20. The planarization layer 272 may be disposed on the insulating interlayer 190, the source electrode 210, the drain electrode 230, and the boundary pattern 364 such that the planarization layer 272 exposes the gate insulation layer 150 that is located in the transparent region 20. In example embodiments, the planarization layer 272 may expose at least a portion of an upper surface of the boundary pattern 364 in a boundary of the sub-pixel region 10 and the transparent region 20. For example, the planarization layer 272 may cover at least a portion of an upper surface of the boundary pattern 364. That is, the planarization layer 272 may not be in directly contact with the gate insulation layer 150. The planarization layer 272 may include organic materials or inorganic materials. In example embodiments, the planarization layer 272 may be formed of organic materials.

The pixel defining layer 312 may be disposed on the protection pattern 380 and the planarization layer 272 such that the pixel defining layer 310 exposes the gate insulation layer 150 that is located in the transparent region 20. For example, the pixel defining layer 312 may cover both lateral portions of the protection pattern 380, and may be disposed on the planarization layer 272. The pixel defining layer 312 may not cover sidewall of the planarization layer 272 but only cover an upper surface of the planarization layer 272. The pixel defining layer 312 may have a second opening exposing the gate insulation layer 150 that is located in the transparent region 20 on the substrate 110. A size of the second opening may be greater than that of the first opening, and the first and second openings may be a transparent window illustrated in FIG. 1. The pixel defining layer 312 may be formed of organic materials or inorganic materials. In example embodiments, the pixel defining layer 310 may include organic materials. The first opening and the second opening may be formed using a same mask.

Figure 19:
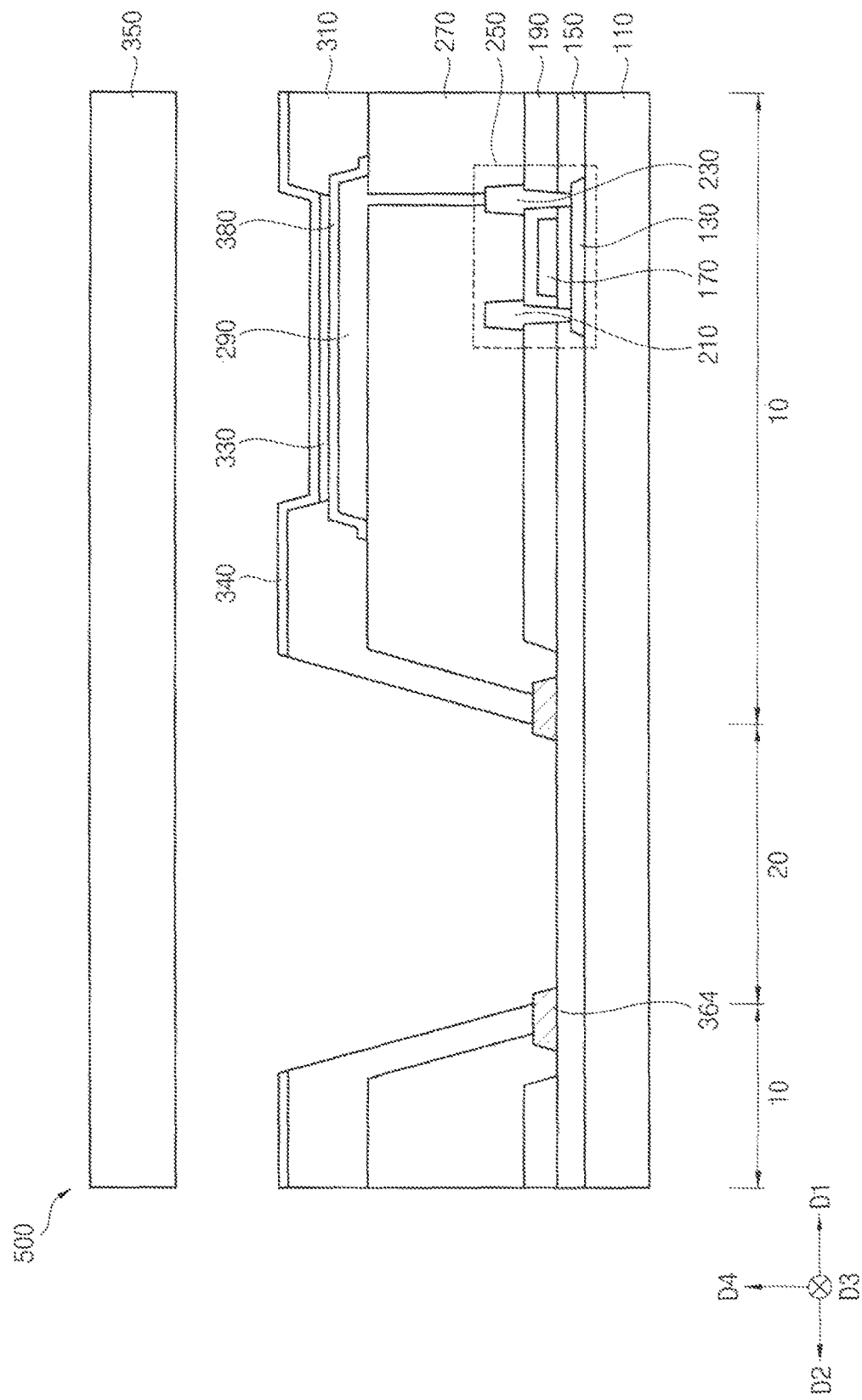
FIG. 19 is a cross-sectional view illustrating the OLED device in accordance with example embodiments.

FIG. 19 is a cross-sectional view illustrating the OLED device in accordance with example embodiments. An OLED device 500 illustrated in FIG. 19 may have a configuration substantially the same as or similar to that of an OLED device 100 described with reference to FIG. 2 except a boundary pattern 364. In FIG. 19, detailed descriptions for elements, which are substantially the same as or similar to the elements described with reference to FIG. 2, will be omitted.

Referring to FIGS. 2, 3, and 19, an OLED device 500 may include a substrate 110, a semiconductor element 250, a planarization layer 270, a sub-pixel structure, a boundary pattern 364, a protection pattern 380, a pixel defining layer 310, an encapsulation substrate 350, etc. Here, the semiconductor element 250 may include an active layer 130, a gate insulation layer 150, a gate electrode 170, an insulating interlayer 190, a source electrode 210, and a drain electrode 230. The sub-pixel structure may include a lower electrode 290, a light emitting layer 330, and an upper electrode 340. As illustrated in FIG. 3, the lower electrode 290 may include a first transparent electrode film 291, a reflective electrode film 292, and a second transparent electrode film 293.

The boundary pattern 364 may be in simultaneously contact with both a lower surface of the planarization layer 270 and an upper surface of the gate insulation layer 150 in a boundary of the sub-pixel region 10 and the transparent region 20. In example embodiments, the boundary pattern 364 may extend in a direction from a lower surface of the planarization layer 270 into the transparent region 20 on the gate insulation layer 150. For example, the boundary pattern 364 may be disposed in a portion of the sub-pixel region 10 and a portion of the transparent region 20. In addition, the boundary pattern 364 may be parallel to an upper surface of the gate insulation layer 150. The boundary pattern 364 may cover a portion where a lower surface of the planarization layer 270 and an upper surface of the gate insulation layer 150 are simultaneously contacted. That is, the boundary pattern 364 may be in simultaneously contact with both a lower surface of the planarization layer 270 and an upper surface of the gate insulation layer 150, and may extend along a boundary of the sub-pixel region 10 and the transparent region 20 (refer to FIG. 1). In addition, the boundary pattern 364 may have a substantially athletic track shape. For example, in a boundary of the sub-pixel region 10 and the transparent region 20, the boundary pattern 364 may prevent water or moisture from permeating into an interface between the planarization layer 270 and the gate insulation layer 150. In addition, since the pixel defining layer 310 are disposed on the boundary pattern 364, the pixel defining layer 310 may not be in directly contact with the gate insulation layer 150. In example embodiments, the boundary pattern 364 and the gate electrode 170 may be located at the same level, and the boundary pattern 364 and the gate electrode 170 may be simultaneously formed by using the same material. For example, the boundary pattern 364 may include a metal, a metal alloy, metal nitride, conductive metal oxide, transparent conductive materials, etc.

As the boundary pattern 364 and the gate electrode 170 are simultaneously formed using the same materials, a manufacturing cost of the OLED device 500 may be reduced.

The present invention may be applied to various display devices including an organic light emitting display device. For example, the present invention may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display (OLED) device, comprising:
    a substrate including a sub-pixel region and a transparent region;
    a gate insulation layer on the substrate;
    a planarization layer in the sub-pixel region on the gate insulation layer, the planarization layer exposing the transparent region;
    a boundary pattern which covers a boundary of the sub-pixel region and the transparent region, the boundary pattern including:
        a first boundary extension extending in a direction from the boundary of the sub-pixel region and the transparent region into the sub-pixel region, the first boundary extension extending onto the sidewall of the planarization layer, and
        a second boundary extension extending in a direction from the boundary of the sub-pixel region and the transparent region into the transparent region, the second boundary extension extending onto an upper surface of the gate insulation layer that is located in transparent region on the substrate;
    a pixel defining layer on the planarization layer, the pixel defining layer exposing the transparent region and exposing at least a portion of an upper surface of the boundary pattern in the transparent region; and
    a sub-pixel structure on the planarization layer.

2. The OLED device of claim 1, wherein the first boundary extension and the second boundary extension are integrally formed, and the boundary pattern covers a portion where the sidewall of the planarization layer, a lower surface of the planarization layer, and an upper surface of the gate insulation layer are simultaneously contacted.

3. The OLED device of claim 2, wherein the sub-pixel structure includes:
    a lower electrode on the planarization layer;
    a light emitting layer on the lower electrode; and
    an upper electrode on the light emitting layer,
    wherein the upper electrode and the boundary pattern are simultaneously formed using the same materials.

4. The OLED device of claim 1, further comprising an insulating interlayer disposed between a gate electrode and the planarization layer.

5. The OLED device of claim 4, wherein the first boundary extension and the second boundary extension are integrally formed, and the boundary pattern covers a portion where the sidewall of the insulating interlayer and an upper surface of the gate insulation layer are simultaneously contacted.

6. The OLED device of claim 5, wherein the sub-pixel structure includes:
    a lower electrode on the planarization layer;
    a light emitting layer on the lower electrode; and
    an upper electrode on the light emitting layer,
    wherein the upper electrode and the boundary pattern are simultaneously formed using the same materials.

7. An organic light emitting display (OLED) device, comprising:
    a substrate including a sub-pixel region and a transparent region;
    a gate insulation layer on the substrate;
    a planarization layer in the sub-pixel region on the gate insulation layer, the planarization layer exposing the transparent region;
    an insulating interlayer disposed between a gate electrode and the planarization layer;
    a boundary pattern which covers a boundary of the sub-pixel region and the transparent region, the boundary pattern including:

a first boundary portion covered by the insulating interlayer, and a second boundary extension extending from the boundary of the sub-pixel region and the transparent region onto an upper surface of the gate insulation layer that is located in transparent region on the substrate;

a pixel defining layer on the planarization layer, the pixel defining layer exposing the transparent region and exposing at least a portion of an upper surface of the boundary pattern in the transparent region; and a sub-pixel structure on the planarization layer.

8. The OLED device of claim 7, wherein the gate electrode of a transistor in the sub-pixel region and the boundary pattern are simultaneously formed using the same materials.

9. The OLED device of claim 1, wherein the boundary pattern has a hinge shape.

10. The OLED device of claim 1, wherein the sub-pixel structure includes:

a lower electrode on the planarization layer;

a light emitting layer on the lower electrode; and an upper electrode on the light emitting layer, wherein the upper electrode is disposed in the sub-pixel region, and exposes the gate insulation layer that is located in the transparent region on the substrate.

11. The OLED device of claim 10, wherein the lower electrode includes:

a first transparent electrode film having a first thickness on the planarization layer;

a reflective electrode film having a second thickness on the first transparent electrode film, the second thickness being greater than the first thickness; and a second transparent electrode film having a third thickness on the reflection electrode film, the third thickness being less than the first thickness.

12. The OLED device of claim 11, further comprising:

a protection pattern having the third thickness on the second transparent electrode film, the protection pattern covering the lower electrode.

13. The OLED device of claim 12, wherein the boundary pattern and the protection pattern are simultaneously formed using the same materials.

14. The OLED device of claim 1, further comprising:

a semiconductor element in the sub-pixel region on the substrate, wherein the semiconductor element includes:

an active layer on the substrate;

a gate electrode on the gate insulation layer covering the active layer; and source and drain electrodes on the gate electrode.

15. The OLED device of claim 14, further comprising:

an insulating interlayer interposed between the gate insulation layer and the planarization layer, the insulating interlayer covering the gate insulation layer in the sub-pixel region on the substrate, the insulating interlayer exposing the gate insulation layer that is located in the transparent region on the substrate.

16. The OLED device of claim 15, wherein the boundary pattern and the gate electrode are located at the same level.

* * * * *